United States Patent
Kaneko

(10) Patent No.: US 10,985,171 B2
(45) Date of Patent: Apr. 20, 2021

(54) THREE-DIMENSIONAL FLAT NAND MEMORY DEVICE INCLUDING WAVY WORD LINES AND METHOD OF MAKING THE SAME

(71) Applicant: SANDISK TECHNOLOGIES LLC, Addison, TX (US)

(72) Inventor: Ryosuke Kaneko, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/142,447

(22) Filed: Sep. 26, 2018

(65) Prior Publication Data

US 2020/0098773 A1 Mar. 26, 2020

(51) Int. Cl.
| | |
|---|---|
| H01L 29/00 | (2006.01) |
| H01L 27/11565 | (2017.01) |
| H01L 27/11524 | (2017.01) |
| H01L 27/11556 | (2017.01) |
| H01L 27/1157 | (2017.01) |
| H01L 27/11582 | (2017.01) |

(Continued)

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11556* (2013.01); *H01L 27/11582* (2013.01); *H01L 29/40114* (2019.08); *H01L 29/40117* (2019.08)

(58) Field of Classification Search
CPC ......... H01L 27/11565; H01L 29/40114; H01L 29/40117
See application file for complete search history.

(56) References Cited

U.S. PATENT DOCUMENTS

| 5,915,167 A | 6/1999 | Leedy |
| 8,349,681 B2 | 1/2013 | Alsmeier |
| 9,455,267 B2 | 9/2016 | Zhang et al. |

(Continued)

FOREIGN PATENT DOCUMENTS

| KR | 1020100104908 A | 9/2010 |
| KR | 1020170130797 A | 11/2017 |

OTHER PUBLICATIONS

Notification of Transmittal of the International Search Report and Written Opinion of the International Search Authority or International Patent Application No. PCT/US2019/034791, dated Sep. 20, 2019, 11 pages.

(Continued)

*Primary Examiner* — Mounir S Amer
*Assistant Examiner* — Alexander Belousov
(74) *Attorney, Agent, or Firm* — The Marbury Law Group PLLC

(57) ABSTRACT

A three-dimensional memory device includes alternating stacks of insulating strips and electrically conductive strips located over a substrate, generally extending along a first horizontal direction, and laterally spaced apart from each other along a second horizontal direction by width-modulated line trenches, memory films located on a respective sidewall of the alternating stacks, generally extending along the first horizontal direction, and laterally undulating along the second horizontal direction, and a plurality of discrete vertical semiconductor channels located on a sidewall of a respective one of the memory films.

19 Claims, 34 Drawing Sheets

(51) Int. Cl.
*H01L 27/11519* (2017.01)
*H01L 21/28* (2006.01)

(56) References Cited

U.S. PATENT DOCUMENTS

| | | | |
|---|---|---|---|
| 9,553,146 B2 | 1/2017 | Zhang et al. | |
| 9,620,514 B2 | 4/2017 | Kai et al. | |
| 9,627,399 B2 | 4/2017 | Kanakamedala et al. | |
| 9,666,594 B2 | 5/2017 | Mizuno et al. | |
| 9,728,546 B2 | 8/2017 | Serov et al. | |
| 9,837,431 B2 | 12/2017 | Nishikawa et al. | |
| 10,644,024 B2 * | 5/2020 | Wang | H01L 27/11565 |
| 2002/0137290 A1 | 9/2002 | Wils et al. | |
| 2002/0137296 A1 | 9/2002 | Satoh et al. | |
| 2003/0022500 A1 | 1/2003 | Tang | |
| 2003/0080391 A1 | 5/2003 | Hirai et al. | |
| 2003/0143790 A1 | 7/2003 | Wu | |
| 2003/0143792 A1 | 7/2003 | Satoh et al. | |
| 2004/0014274 A1 | 1/2004 | Wils et al. | |
| 2004/0206982 A1 | 10/2004 | Lee et al. | |
| 2004/0258132 A1 | 12/2004 | Hong | |
| 2005/0036382 A1 | 2/2005 | Kato | |
| 2005/0068834 A1 | 3/2005 | Kim et al. | |
| 2005/0254293 A1 | 11/2005 | Horng et al. | |
| 2006/0001215 A1 | 1/2006 | Taghavi | |
| 2006/0120133 A1 | 6/2006 | Star Sung et al. | |
| 2006/0209495 A1 | 9/2006 | Lee et al. | |
| 2006/0267077 A1 | 11/2006 | Kato | |
| 2006/0284242 A1 | 12/2006 | Jo | |
| 2007/0015294 A1 | 1/2007 | Horng et al. | |
| 2007/0108498 A1 | 5/2007 | Lee et al. | |
| 2007/0161263 A1 | 7/2007 | Meisner | |
| 2007/0182914 A1 | 8/2007 | Hwang | |
| 2007/0187730 A1 | 8/2007 | Park et al. | |
| 2007/0252188 A1 | 11/2007 | Isobe | |
| 2008/0001209 A1 | 1/2008 | Cho et al. | |
| 2008/0018990 A1 | 1/2008 | Sridhar et al. | |
| 2008/0068896 A1 | 3/2008 | Perlegos et al. | |
| 2008/0112209 A1 | 5/2008 | Cho et al. | |
| 2008/0175031 A1 | 7/2008 | Park et al. | |
| 2008/0209159 A1 | 8/2008 | Kim et al. | |
| 2008/0290395 A1 | 11/2008 | Jeong | |
| 2009/0173934 A1 | 7/2009 | Jain | |
| 2010/0068857 A1 | 3/2010 | Isobe | |
| 2010/0190291 A1 | 7/2010 | Lee et al. | |
| 2011/0183188 A1 | 7/2011 | Ogg | |
| 2011/0309430 A1 | 12/2011 | Purayath et al. | |
| 2013/0016557 A1 | 1/2013 | Kim | |
| 2013/0178012 A1 | 7/2013 | Wang et al. | |
| 2013/0178013 A1 | 7/2013 | Wang et al. | |
| 2013/0178014 A1 | 7/2013 | Wang et al. | |
| 2013/0309555 A1 | 11/2013 | Ogg | |
| 2013/0328005 A1 | 12/2013 | Shin et al. | |
| 2013/0333205 A1 | 12/2013 | Ogg | |
| 2015/0048293 A1 | 2/2015 | Park | |
| 2015/0102282 A1 | 4/2015 | Zhang et al. | |
| 2015/0104919 A1 | 4/2015 | Park | |
| 2015/0123191 A1 | 5/2015 | Purayath et al. | |
| 2015/0129827 A1 | 5/2015 | Chen et al. | |
| 2015/0263123 A1 | 9/2015 | Cheng et al. | |
| 2016/0020517 A1 | 1/2016 | Florek et al. | |
| 2016/0308069 A1 | 10/2016 | Tseng et al. | |
| 2017/0005849 A1 | 1/2017 | Hang et al. | |
| 2017/0148805 A1 * | 5/2017 | Nishikawa | H01L 27/11524 |
| 2017/0243879 A1 | 8/2017 | Yu et al. | |
| 2017/0271402 A1 | 9/2017 | Chen et al. | |
| 2018/0006041 A1 | 1/2018 | Xu et al. | |
| 2018/0012292 A1 | 1/2018 | Sugiyama et al. | |
| 2018/0012937 A1 | 1/2018 | Park et al. | |
| 2018/0040623 A1 | 2/2018 | Kanakamedala et al. | |

OTHER PUBLICATIONS

H. Lue et al., "A 128Gb (MLC)/192GB (TLC) single-gate vertical channel (SGVC) architecture 3D NAND using only 16 layers with robust read disturb, long-retention and excellent scaling capability," *2017 IEEE International Electron Devices Meeting (IEDM)*, San Francisco, CA, 2017, pp. 19.1.1-19.1.4.

U.S. Appl. No. 15/971,525, filed May 4, 2018, Sandisk Technologies LLC.

U.S. Appl. No. 16/002,294, filed Jun. 7, 2018, Sandisk Technologies LLC.

U.S. Appl. No. 16/020,505, filed Jun. 27, 2018, Sandisk Technologies LLC.

U.S. Appl. No. 16/021,899, filed Jun. 28, 2018, Sandisk Technologies LLC.

U.S. Appl. No. 16/136,652, filed Sep. 20, 2018, Sandisk Technologies LLC.

* cited by examiner

THREE-DIMENSIONAL FLAT NAND MEMORY DEVICE INCLUDING WAVY WORD LINES AND METHOD OF MAKING THE SAME

FIELD

The present disclosure relates generally to the field of semiconductor devices, and particular to a three-dimensional flat NAND memory device including wavy word lines and methods of manufacturing the same.

BACKGROUND

A configuration of a three-dimensional NAND memory device employs flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device includes alternating stacks of insulating strips and electrically conductive strips located over a substrate, generally extending along a first horizontal direction, and laterally spaced apart from each other along a second horizontal direction by width-modulated line trenches, memory films located on a respective sidewall of the alternating stacks, generally extending along the first horizontal direction, and laterally undulating along the second horizontal direction, and a plurality of discrete vertical semiconductor channels located on a sidewall of a respective one of the memory films.

According to another aspect of the present disclosure, a method of forming a three-dimensional memory device comprises forming a vertically alternating sequence of insulating layers and sacrificial material layers over a substrate, forming width-modulated line trenches laterally extending along a first horizontal direction and laterally spaced apart along a second horizontal direction through the vertically alternating sequence to form alternating stacks of insulating strips and sacrificial material strips, forming memory films on respective sidewalls of the alternating stacks, wherein each of the memory films generally extends along the first horizontal direction, and laterally undulates along the second horizontal direction, and forming discrete vertical semiconductor channels on a respective one of the memory films.

DETAILED DESCRIPTION

Figure 1:
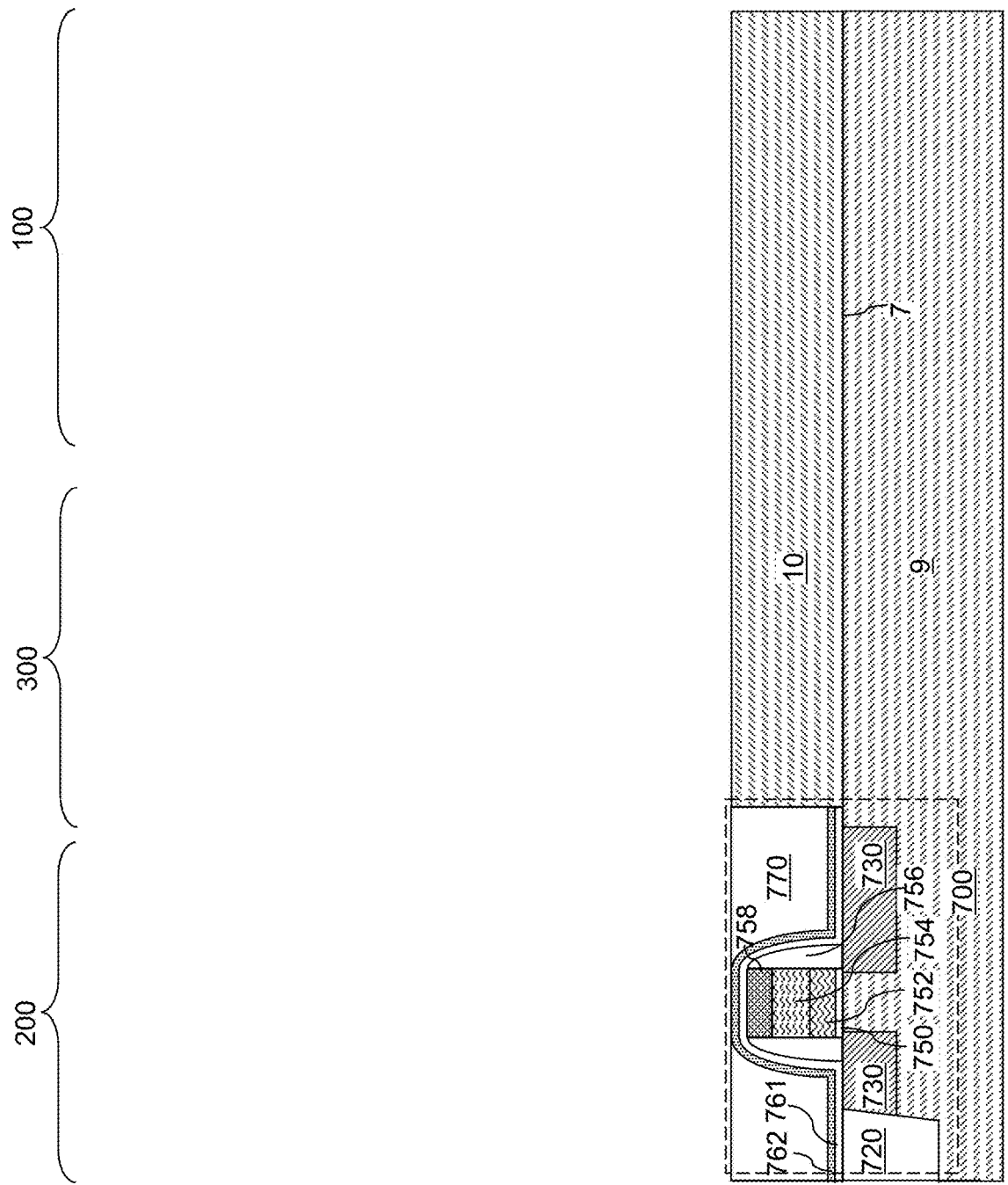
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional flat NAND memory device including wavy word lines and methods of manufacturing the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770. In one embodiment, the semiconductor material layer 10 can have a doping of a first conductivity type.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive strips can be provided between the memory array region 100 and the peripheral device region 200.

Figure 2:
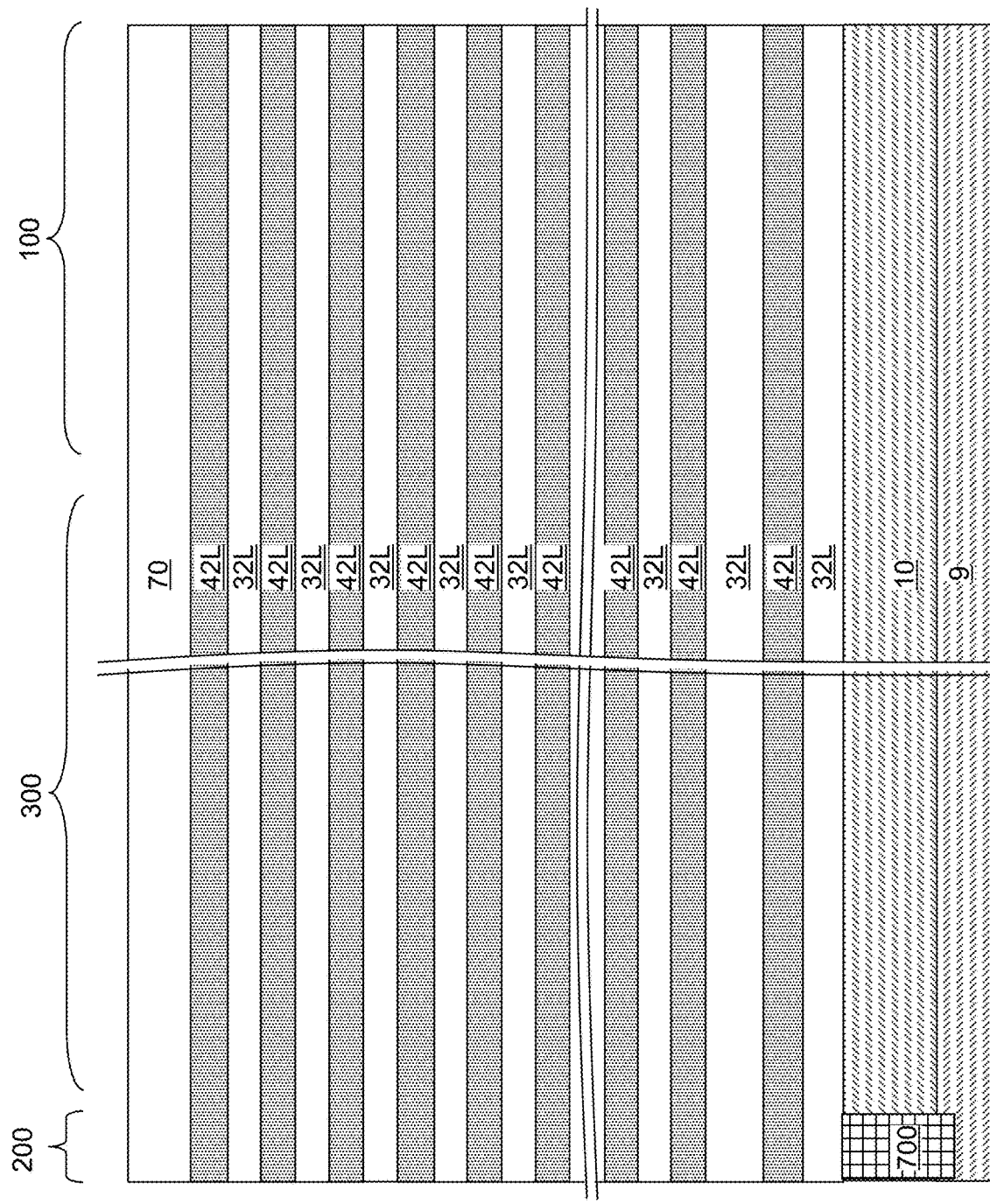
FIG. 2 is a schematic vertical cross-sectional view of the exemplary structure after formation of a vertically alternating sequence of insulating layers and spacer material layers according to an embodiment of the present disclosure.

Referring to FIG. 2, a vertically alternating sequence of first material layers (such as insulating layers 32L) and second material layers (such as spacer material layers) is formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32L) and second material layers (which can be sacrificial material layer 42L). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32L, and each second material layer can be a sacrificial material layer. In this case, the stack can include an alternating plurality of insulating layers 32L and sacrificial material layers 42L, and constitutes a prototype stack of alternating layers comprising insulating layers 32L and sacrificial material layers 42L. As used herein, a "prototype" structure or an "in-process" structure refers to a transient structure that is subsequently modified in the shape or composition of at least one component therein.

In one embodiment, the vertically alternating sequence (32L, 42L) can include insulating layers 32L composed of the first material, and sacrificial material layers 42L composed of a second material different from that of insulating layers 32L. The first material of the insulating layers 32L can be at least one insulating material. As such, each insulating layer 32L can be an insulating material layer. Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42L can be spacer material layers that comprise silicon nitride or a semiconductor material including at least one of silicon and germanium.

In one embodiment, the insulating layers 32L can include silicon oxide, and sacrificial material layers can include silicon nitride sacrificial material layers. The first material of the insulating layers 32L can be deposited, for example, by chemical vapor deposition (CVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD).

The sacrificial material layers 42L can be suitably patterned so that conductive material portions to be subsequently formed by replacement of the sacrificial material layers 42L can function as electrically conductive electrodes, such as the control gate electrodes of the monolithic three-dimensional NAND string memory devices to be subsequently formed. The sacrificial material layers 42L may comprise a portion having a strip shape extending substantially parallel to the major surface 7 of the substrate.

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer (e.g., a control gate electrode or a sacrificial material layer) 42L can be in a range from 2 to 1,024, and typically from 8 to 256, although a greater number of repetitions can also be employed. The top and bottom gate electrodes in the stack may function as the select gate electrodes. In one embodiment, each sacrificial material layer 42L in the vertically alternating sequence (32L, 42L) can have a uniform thickness that is substantially invariant within each respective sacrificial material layer 42L.

While the present disclosure is described employing an embodiment in which the spacer material layers are sacrificial material layers 42L that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

Optionally, an insulating cap layer 70 can be formed over the vertically alternating sequence (32L, 42L). The insulating cap layer 70 includes a dielectric material that is different from the material of the sacrificial material layers 42L. In one embodiment, the insulating cap layer 70 can include a dielectric material that can be employed for the insulating layers 32L as described above. The insulating cap layer 70 can have a greater thickness than each of the insulating layers 32L. The insulating cap layer 70 can be deposited, for example, by chemical vapor deposition. In one embodiment, the insulating cap layer 70 can be a silicon oxide layer.

Figure 3:
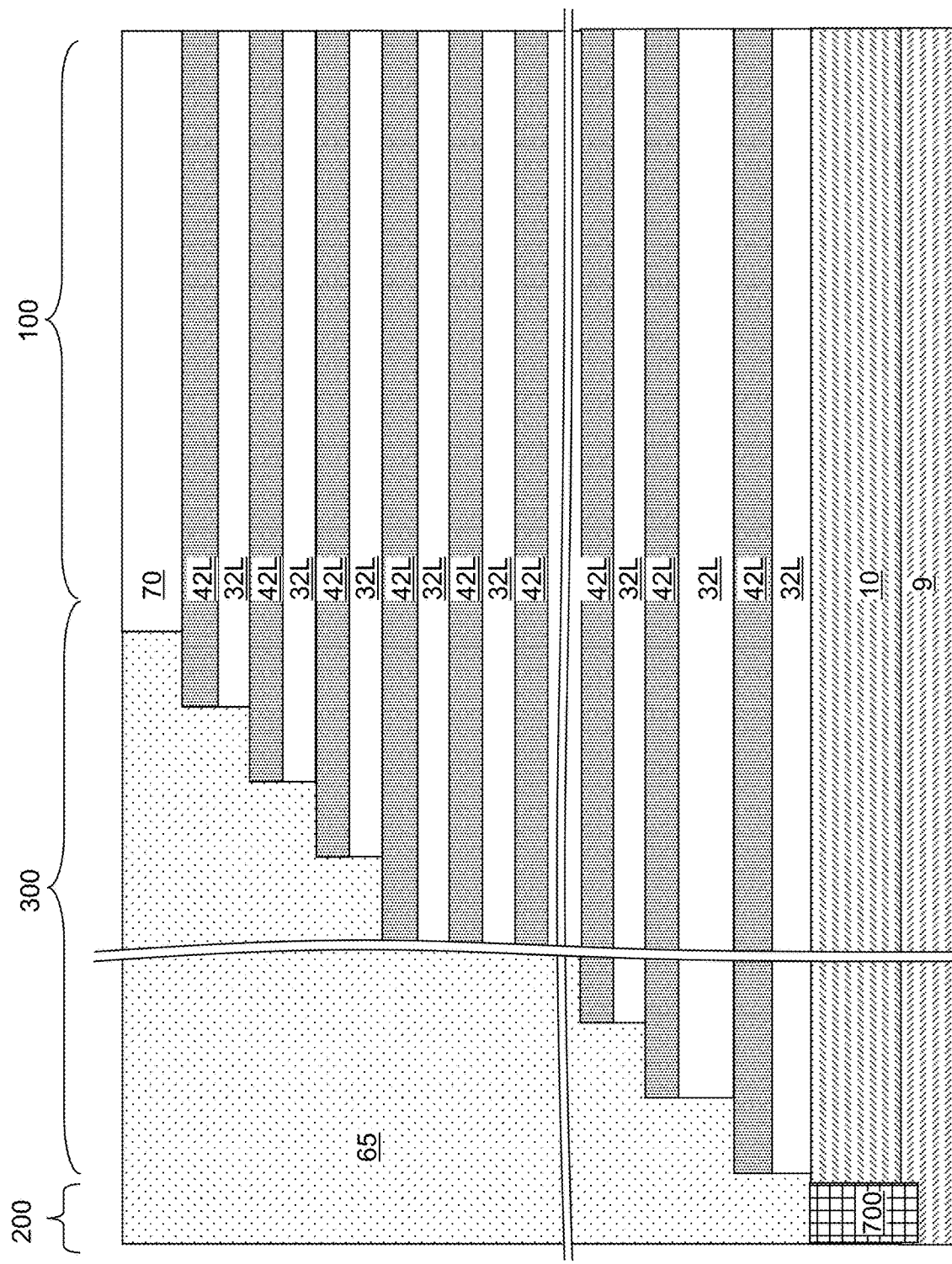
FIG. 3 is a schematic vertical cross-sectional view of the exemplary structure after formation of stepped terraces and a retro-stepped dielectric material portion according to an embodiment of the present disclosure.

Referring to FIG. 3, the vertically alternating sequence of the insulating layers 32L and the spacer material layers (i.e., the sacrificial material layers 42L) can be patterned to form stepped surfaces that continuously extend from a bottommost layer of the vertically alternating sequence (32L, 42L) to a topmost layer of the alternating sequence (32L, 42L) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32L, 42L) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32L, 42L). Each sacrificial material layer 42L other than a topmost sacrificial material layer 42L within the vertically alternating sequence (32L, 42L) laterally extends farther than any overlying sacrificial material layer 42L within the vertically alternating sequence (32L, 42L). The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A-4D, a lithographic material stack (not shown) including at least a photoresist layer can be formed over the insulating cap layer 70 and the retro-stepped dielectric material portion 65, and can be lithographically patterned to form width-modulated openings therein. As used herein, a "width-modulated" element refers to an element in which the width of the element modulates along a lengthwise direction of the element, i.e., repeatedly increases and decreases along the lengthwise direction of the element. The width-modulated openings laterally extend along a first horizontal direction hd1, and have a width modulation along a second horizontal direction hd2 that is perpendicular to the first horizontal direction hd1.

The pattern in the lithographic material stack can be transferred through the insulating cap layer 70 or the retro-stepped dielectric material portion 65, and through the vertically alternating sequence (32L, 42L) by at least one anisotropic etch that employs the patterned lithographic material stack as an etch mask. Portions of the vertically alternating sequence (32L, 42L) underlying the width-modulated openings in the patterned lithographic material stack are etched to form width-modulated line trenches 149. As used herein, a "line trench" refers to a trench that generally extends laterally along a horizontal direction.

The width-modulated line trenches 149 are formed through the vertically alternating sequence (32L, 42L). Each patterned portion of the insulating layers 32L that generally extend along the first horizontal direction hd1 and having lateral undulations in the sidewalls along the second horizontal direction hd2 constitutes an insulating strip 32. Each patterned portion of the sacrificial material layers 42L that generally extend along the second horizontal direction hd2 and having lateral undulations in the sidewalls along the first horizontal direction hd2 constitutes a sacrificial material strip 42. The width-modulated line trenches 149 laterally extend along the first horizontal direction hd1 and are laterally spaced apart along the second horizontal direction hd2. Remaining portions of the vertically alternating stack (32L, 42L) include alternating stacks of insulating strips 32 and sacrificial material strips 42 are formed by remaining portions of the vertically alternating sequence (32L, 42L).

Each of the width-modulated line trenches 149 can be formed with a pair of sidewalls that generally extend along the first horizontal direction (e.g., word line direction) hd1 and having a lateral undulation along the second horizontal direction (e.g., bit line direction) hd2. In one embodiment, each of the pair of sidewalls can include a laterally alternating sequence of laterally-concave and laterally-convex and vertically-planar sidewall segments. Optionally, each paid of sidewalls can also include vertically-planar sidewall segments between laterally-concave and laterally-convex sidewall segments. As used herein, a laterally-concave sidewall refers to a sidewall having a concave horizontal cross-sectional profile. As used herein, a laterally-convex sidewall refers to a sidewall having a convex horizontal cross-sectional profile. As used herein, a vertically-planar sidewall refers to a sidewall having a vertically-extending straight line as a vertical cross-sectional profile.

Figure 4A:
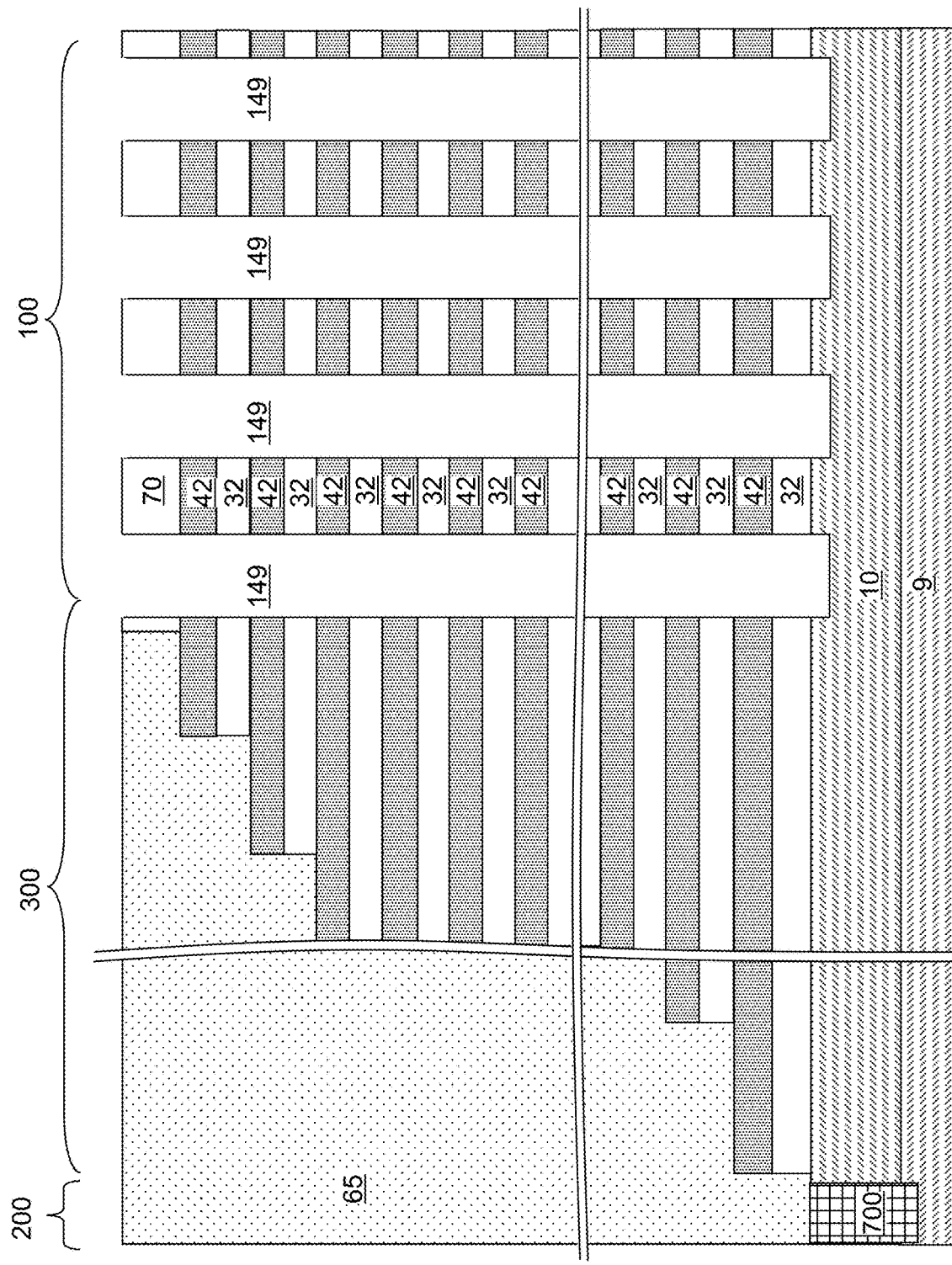
FIG. 4A is a schematic vertical cross-sectional view of the exemplary structure after formation of width-modulated line trenches according to an embodiment of the present disclosure.
Figure 4B:
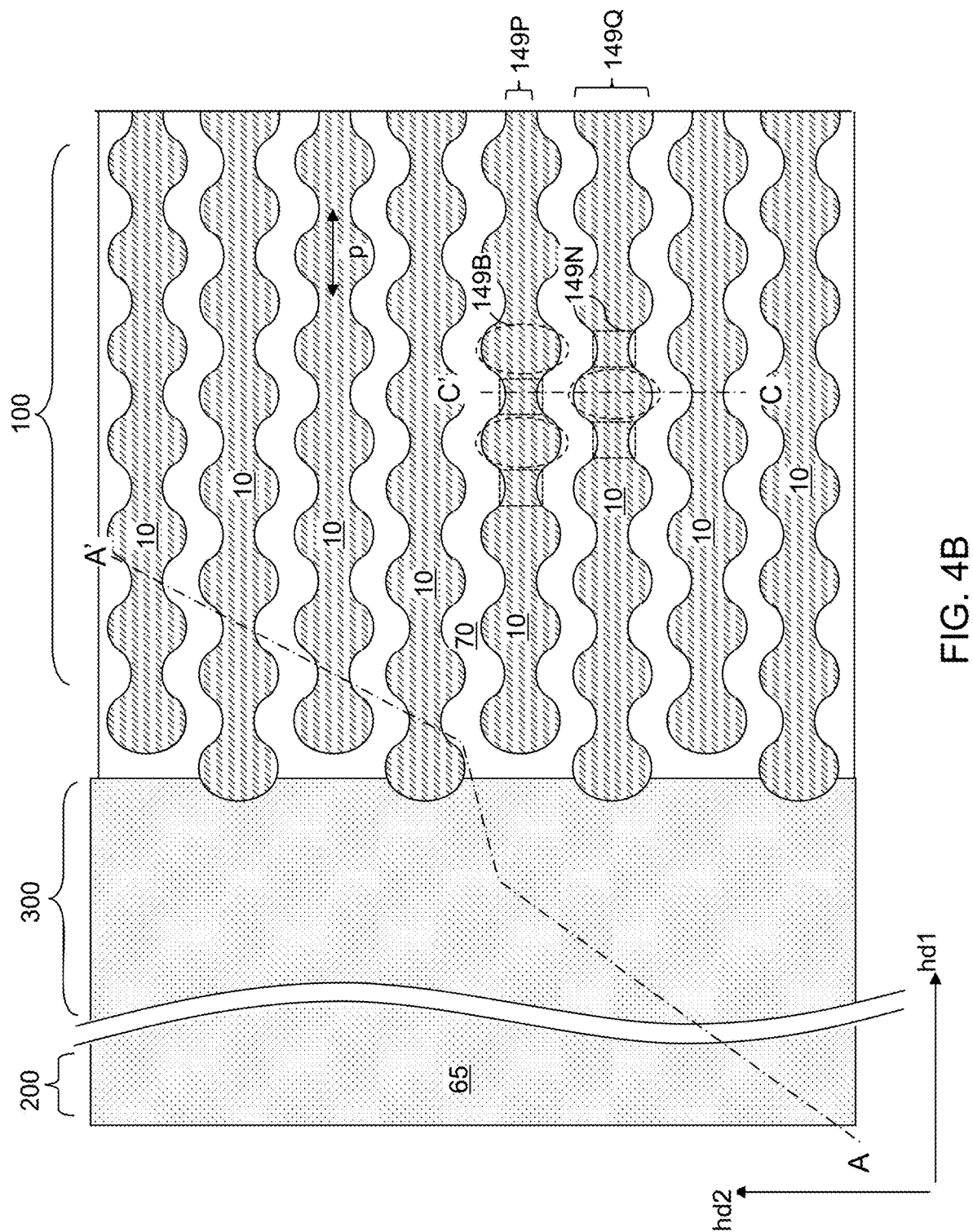
FIG. 4B is a top-down view of the exemplary structure of FIG. 4A. The vertical plane A-A' is the plane of the cross-section for FIG. 4A.
Figure 4C:
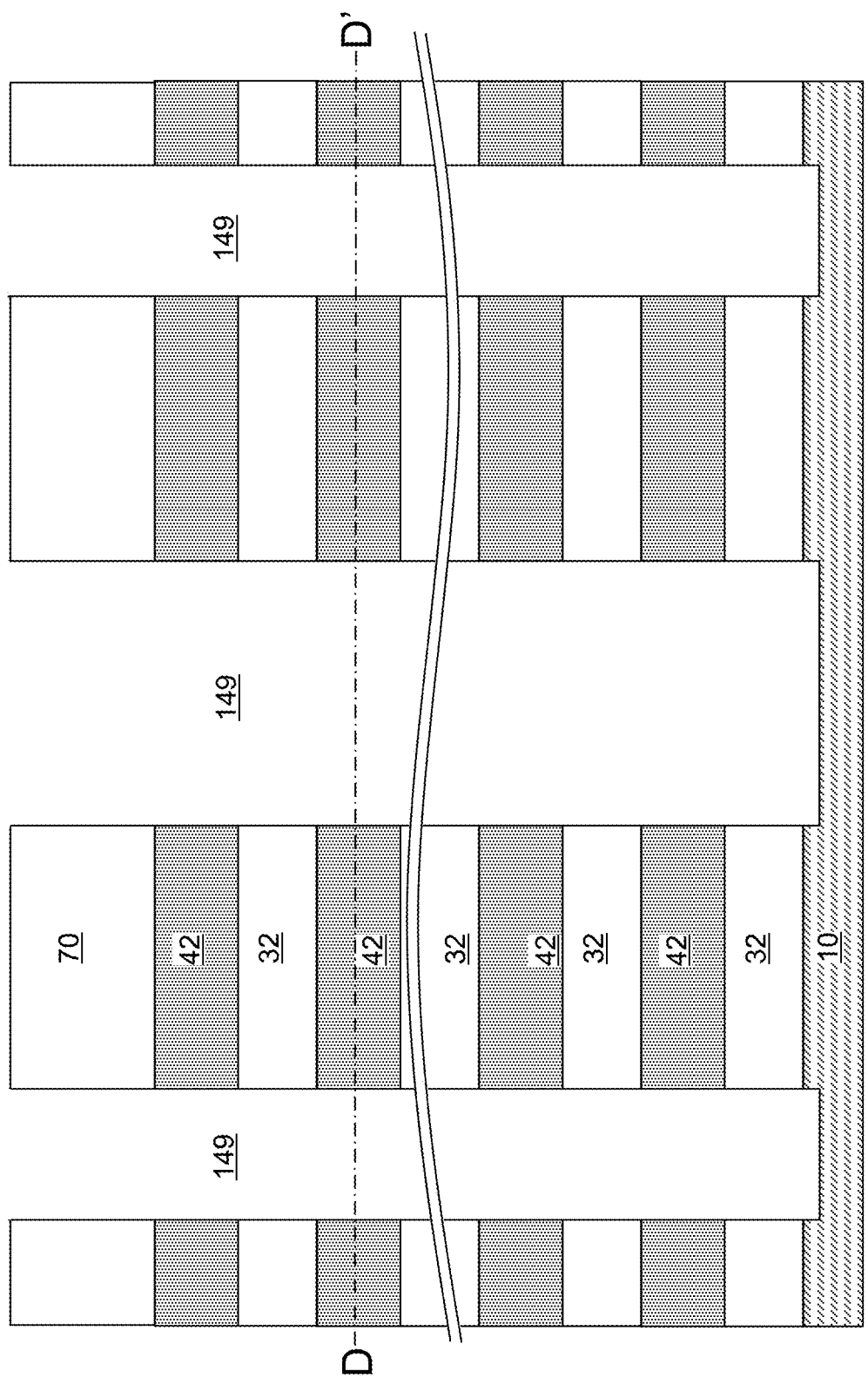
FIG. 4C is a vertical cross-sectional view of the exemplary structure along the vertical plane C-C' of FIG. 4B.
Figure 4D:
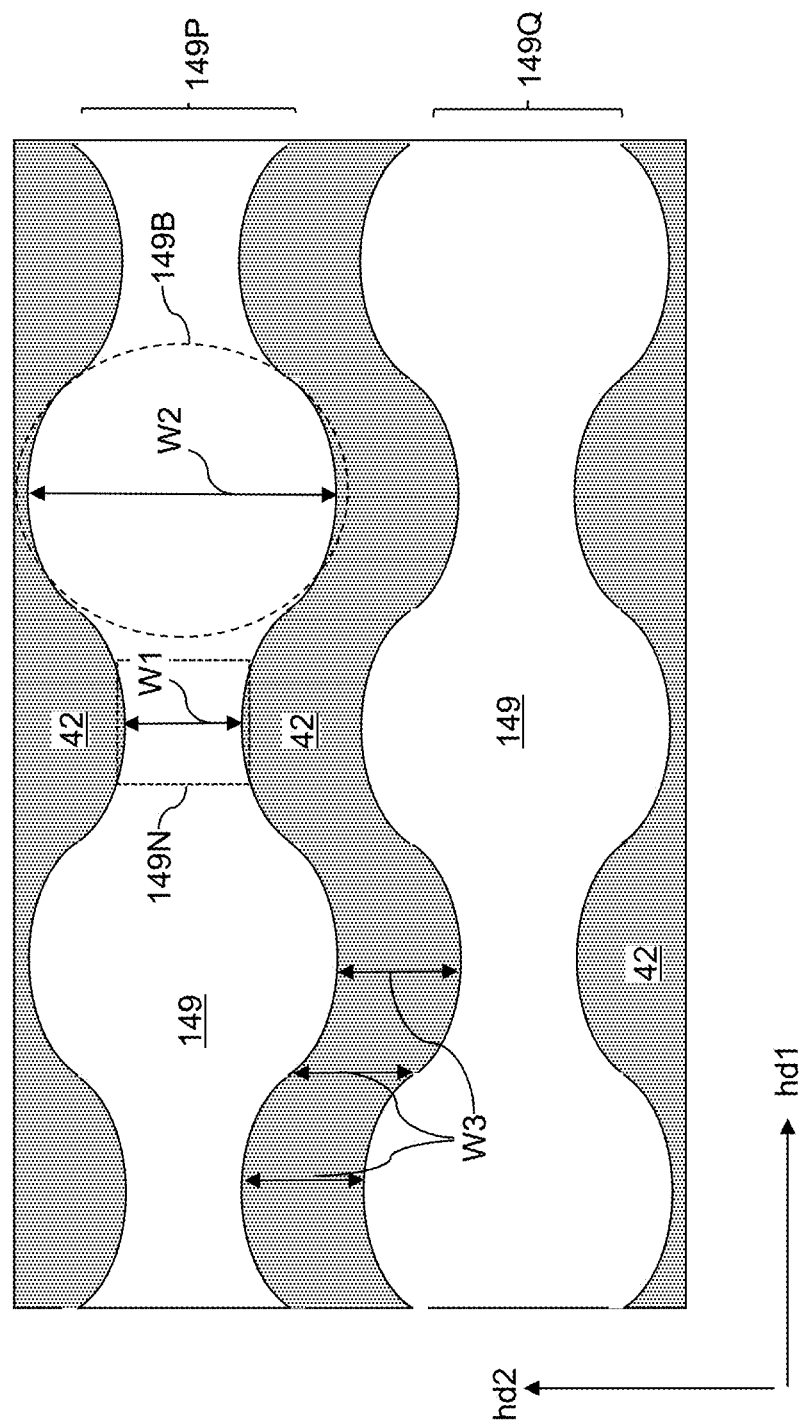
FIG. 4D is a horizontal cross-sectional view of a region of the exemplary structure along the horizontal plane D-D' of FIG. 4C.

In one embodiment shown in FIGS. 4B and 4D, each of the width-modulated line trenches 149 includes a periodic laterally alternating sequence of a neck region 149N and a bulbous region 149B. A neck region 149N refers to a region having a lesser width, W1, than neighboring regions, and a bulbous region 149B refers to a region having a greater width W2 than neighboring regions. In one embodiment, neck regions 149N of a first width-modulated line trench 149P within each neighboring pair of the width-modulated line trenches 149 is laterally offset along the first horizontal direction hd1 from a neck region 149N of a second width-modulated line trench 149Q within each neighboring pair of the width-modulated line trenches 149 by a lateral offset distance that is one half of a periodicity p of neck regions of the first width-modulated line trench 149 along the first horizontal direction hd1.

In one embodiment shown in FIG. 4D, the minimum width W1 of the neck regions 149N in the second horizontal direction is less than the maximum width of the bulbous the neck regions 149N and the bulbous regions 149B in two neighboring width-modulated line trenches 149 can be arranged such that the alternating stack (32, 42) of insulating strips 32 and sacrificial material strips 42 there between has a substantially uniform width W3 or a width variation less than 50%, and/or less than 25%, and/or less than 10%, and/or less than 5% of the average width W3 of the alternating stack (32, 42). In other words, even though the alternating stack (32, 42) has a serpentine shape that extends along the first horizontal direction hd1, the average width W3 of the alternating stack (32, 42) in the second horizontal direction hd2 remains substantially at any location along the first horizontal direction hd1.

The width-modulated line trenches 149 laterally extend through the entire memory array region 100, and may laterally extend at least partly into the contact region 300. The width-modulated line trenches 149 may laterally extend through the entire contact region 300 along the first horizontal direction hd1, or may laterally extend only through part of a width, but not the entire width along the first horizontal direction hd1, of the contact region 300. In one embodiment, an overetch into the semiconductor material layer 10 may be optionally performed after the top surface of the semiconductor material layer 10 is physically exposed at a bottom of each width-modulated line trench 149. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the width-modulated line trenches 149 can be coplanar with the topmost surface of the semiconductor material layer 10.

Each of the width-modulated line trenches 149 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the width-modulated line trenches 149 can be extend to a top surface of the substrate semiconductor layer 9.

In one embodiment, the insulating strips 32 and the sacrificial material strips 42 may be interconnected among one another by a connecting portion provided within the contact region 300, and the insulating strips 32 may be portions of a continuous insulating layer that extend across the memory array region 100 and the contact region 300. In this case, a plurality of alternating stacks of insulating strips 32 and sacrificial material strips 42 may be interconnected among one another by connecting portions within the contact region 300. Alternatively, the insulating strips 32 and the sacrificial material strips 42 may be divided into discrete material strips by the width-modulated line trenches 149.

Figure 5A:
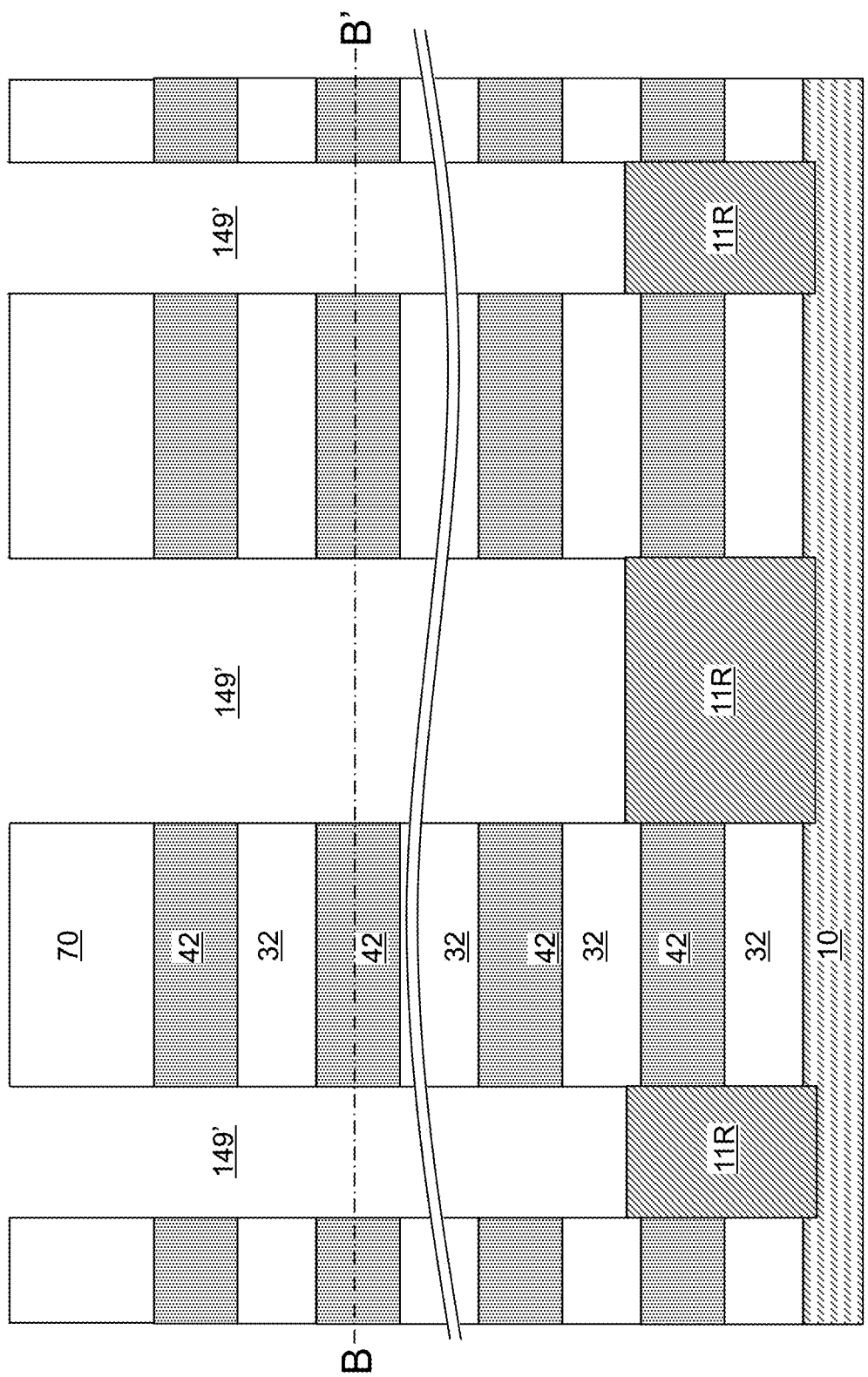
FIG. 5A is a vertical cross-sectional view of the exemplary structure after formation of pedestal channel rails according to an embodiment of the present disclosure.
Figure 5B:
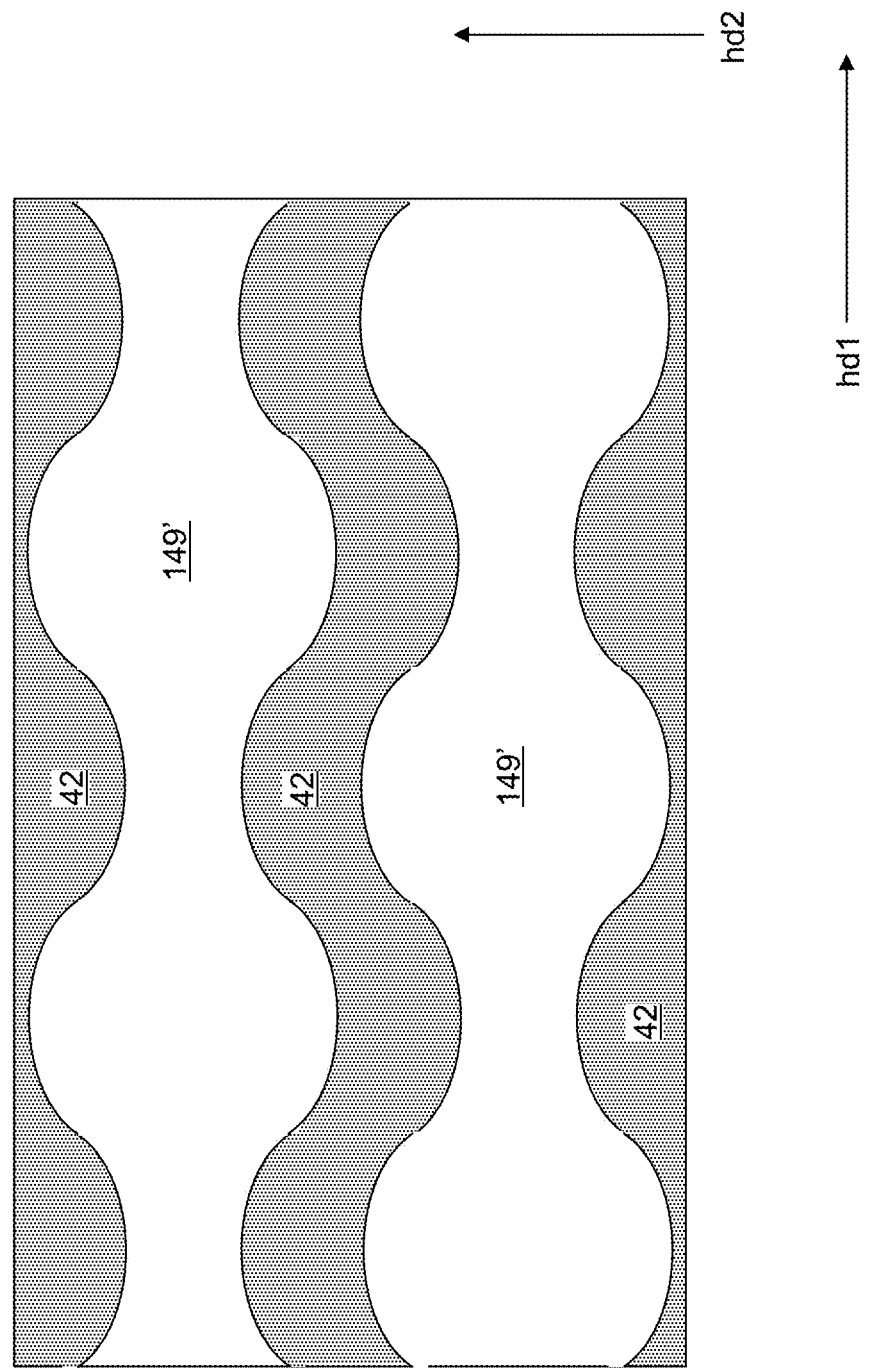
FIG. 5B is a horizontal cross-sectional view of the exemplary structure along the horizontal plane B-B' of FIG. 5A.

Referring to FIGS. 5A and 5B, width-modulated line trenches 149 in the memory array region 100 are illustrated. The width-modulated line trenches 149 extends through the insulating cap layer 70, the alternating stacks (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material strips 42 can be laterally recessed partially to form lateral recesses (not shown), for example, by an isotropic etch.

An optional pedestal channel rail 11R can be formed at the bottom portion of each width-modulated line trench 149 by a selective semiconductor material deposition process such as selective epitaxy. The selective semiconductor material deposition process employs concurrent or alternating flow of a semiconductor precursor and an etchant. Semiconductor surfaces provide a higher deposition rate than insulating surface. By selecting the etch rate of the etchant between the deposition rate of the semiconductor material on semiconductor surfaces and the deposition rate of the semiconductor material on insulating surfaces, the semiconductor material can grow only from physically exposed surfaces during the selective semiconductor material deposition process. In one embodiment, the pedestal channel rail 11R can be doped with electrical dopants of the same conductivity type as the semiconductor material layer 10. In one embodiment, the top surface of each pedestal channel rail 11R can be formed above a horizontal plane including the top surfaces of bottommost sacrificial material strips 42. In this case, at least one source select gate electrode can be subsequently formed by replacing the bottommost sacrificial material strip 42 located below the horizontal plane including the top surfaces of the pedestal channel rails 11R with electrically conductive strips. The pedestal channel rail 11R can be a portion of a transistor channel that extends between a source region to be subsequently formed in the substrate (9, 10) and a drain region to be subsequently formed in an upper portion of the width-modulated line trench 149. A width-modulated line cavity 149' is present in the unfilled portion of the width-modulated line trench 149 above the pedestal channel rail 11R. In one embodiment, the pedestal channel rail 11R can comprise single crystalline silicon. In one embodiment, the pedestal channel rail 11R can have a doping of the first conductivity type, which is the same as the conductivity type of the semiconductor material layer 10 that the pedestal channel rail contacts. If a semiconductor material layer 10 is not present, the pedestal channel rail 11R can be formed directly on the substrate semiconductor layer 9, which can have a doping of the first conductivity type.

Figure 6A:
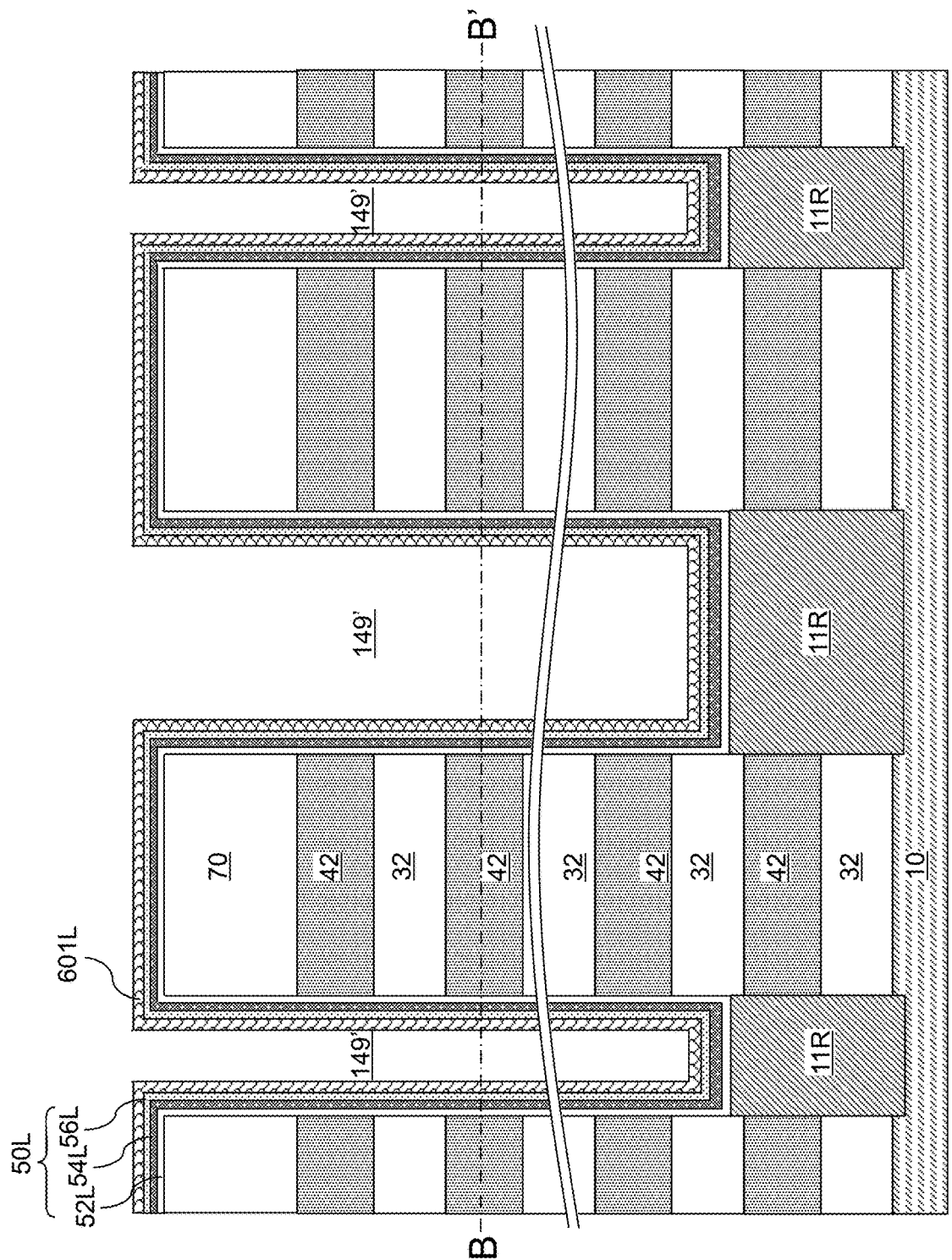
FIG. 6A is a vertical cross-sectional view of the exemplary structure after formation of a continuous memory film layer and a first continuous semiconductor channel material layer according to an embodiment of the present disclosure.
Figure 6B:
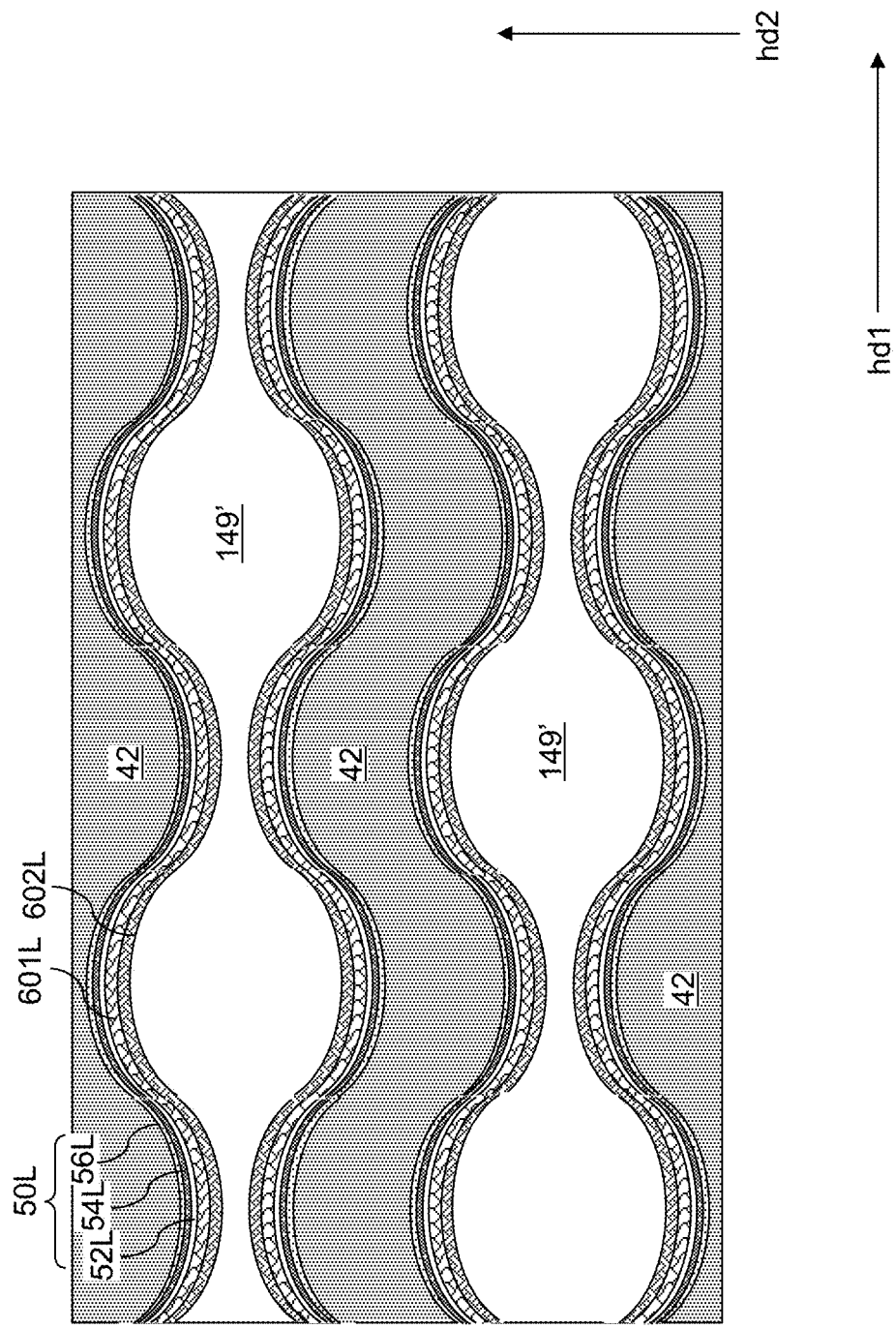
FIG. 6B is a horizontal cross-sectional view of the exemplary structure along the horizontal plane B-B' of FIG. 6A.

Referring to FIGS. 6A and 6B, a continuous memory film layer 50L is formed in the width-modulated line trenches 149. The continuous memory film layer 50L includes a stack of layers including a continuous blocking dielectric layer 52L, a continuous charge storage layer 54L, and a continuous tunneling dielectric layer 56L.

The continuous blocking dielectric layer 52L can include a single dielectric material layer or a stack of a plurality of dielectric material layers. In one embodiment, the continuous blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the continuous blocking dielectric layer 52L includes aluminum oxide. In one embodiment, the continuous blocking dielectric layer 52L can include multiple dielectric metal oxide layers having different material compositions.

Alternatively or additionally, the continuous blocking dielectric layer 52L can include a dielectric semiconductor compound such as silicon oxide, silicon oxynitride, silicon nitride, or a combination thereof. In one embodiment, the continuous blocking dielectric layer 52L can include silicon oxide. In this case, the dielectric semiconductor compound of the continuous blocking dielectric layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the continuous blocking dielectric layer 52L can be omitted, and a backside continuous blocking dielectric layer can be formed after formation of backside recesses on surfaces of memory films to be subsequently formed.

Subsequently, the continuous charge storage layer 54L can be formed. In one embodiment, the continuous charge storage layer 54L can be a continuous layer or patterned discrete portions of a charge trapping material including a dielectric charge trapping material, which can be, for example, silicon nitride. Alternatively, the continuous charge storage layer 54L can include a continuous layer or patterned discrete portions of a conductive material such as doped polysilicon or a metallic material that is patterned into multiple electrically isolated portions (e.g., floating gates), for example, by being formed within lateral recesses into sacrificial material strips 42. In one embodiment, the continuous charge storage layer 54L includes a silicon nitride layer. In one embodiment, the sacrificial material strips 42 and the insulating strips 32 can have vertically coincident sidewalls, and the continuous charge storage layer 54L can be formed as a single continuous layer.

In another embodiment, the sacrificial material strips 42 can be laterally recessed with respect to the sidewalls of the insulating strips 32, and a combination of a deposition process and an anisotropic etch process can be employed to form the continuous charge storage layer 54L as a plurality of memory material portions that are vertically spaced apart. While the present disclosure is described employing an embodiment in which the continuous charge storage layer 54L is a single continuous layer, embodiments are expressly contemplated herein in which the continuous charge storage layer 54L is replaced with a plurality of memory material portions (which can be charge trapping material portions or electrically isolated conductive material portions) that are vertically spaced apart.

The continuous charge storage layer 54L can be formed as a single continuous charge storage layer of homogeneous composition, or can include a stack of multiple continuous charge storage layers. The multiple continuous charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous charge storage layer 54L may comprise an insulating charge trapping material, such as one or more silicon nitride segments. Alternatively, the continuous charge storage layer 54L may comprise conductive nanoparticles such as metal nanoparticles, which can be, for example, ruthenium nanoparticles. The continuous charge storage layer 54L can be formed, for example, by chemical vapor deposition (CVD), atomic layer deposition (ALD), physical vapor deposition (PVD), or any suitable deposition technique for storing electrical charges therein. The thickness of the continuous charge storage layer 54L can be in a range from 2 nm to 20 nm, although lesser and greater thicknesses can also be employed.

The continuous tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be employed.

An optional first continuous semiconductor channel material layer 601L can be deposited on the continuous memory film layer 50L. The optional first continuous semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first continuous semiconductor channel material layer 601L includes amorphous silicon or polysilicon. The first continuous semiconductor channel material layer 601L can be formed by a conformal deposition method such as low pressure chemical vapor deposition (LPCVD). The thickness of the first continuous semiconductor channel material layer 601L can be in a range from 2 nm to 10 nm, although lesser and greater thicknesses can also be employed. A width-modulated line cavity 149' is formed in the volume of each width-modulated line trench 149 that is not filled with the deposited material layers (52L, 54L, 56L, 601L).

The continuous memory film layer 50L is formed on the sidewalls of the alternating stacks (32, 42) in the width-modulated line trenches 149. The continuous memory film layer 50L includes a continuous blocking dielectric layer 52L that contacts a respective one of the alternating stacks (32, 42), a continuous charge storage layer 54L contacting the continuous blocking dielectric layer 52L, and a continuous tunneling dielectric layer 56L contacting the continuous charge storage layer 54L and the first continuous semiconductor channel material layer 601L.

Figure 7A:
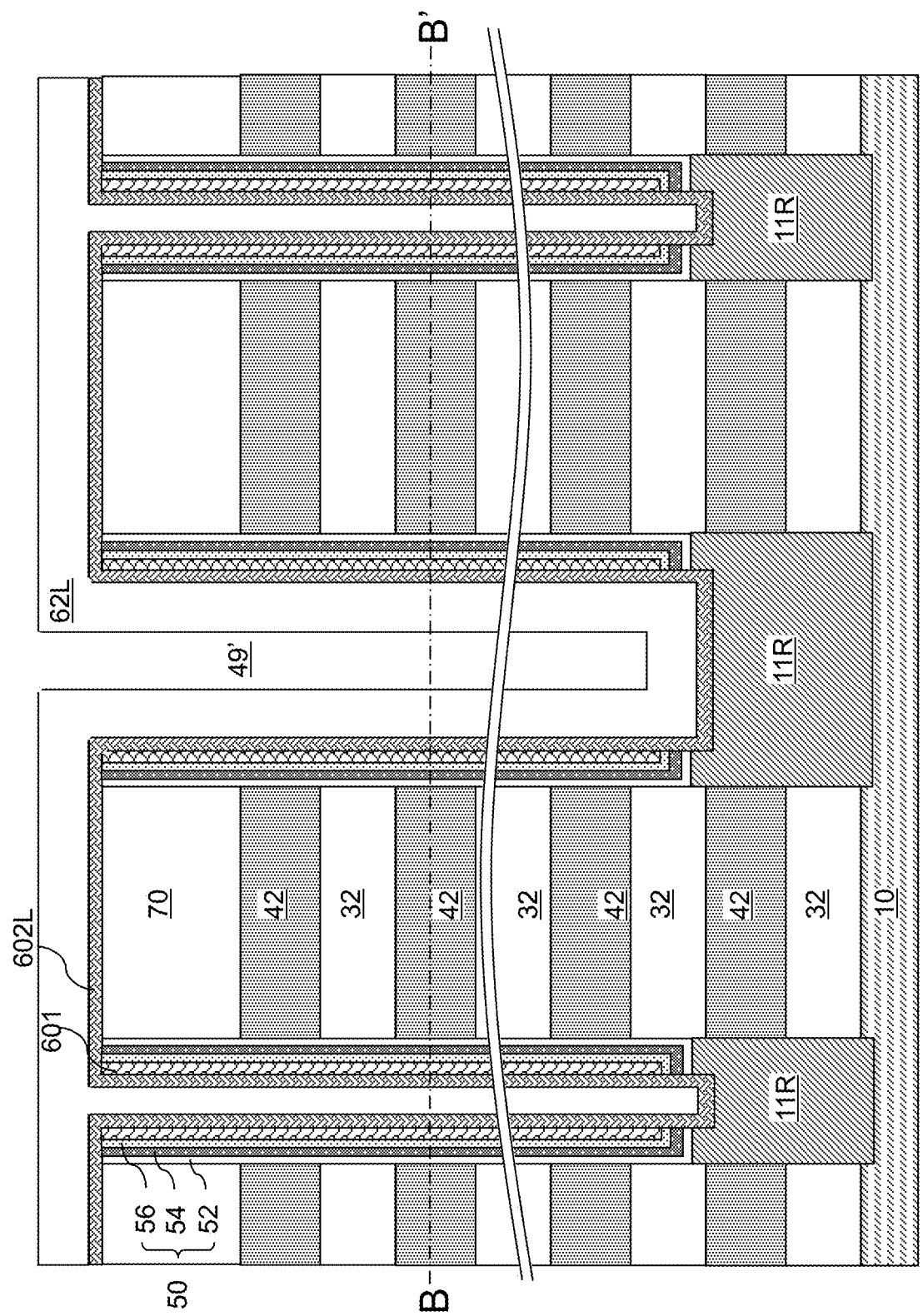
FIG. 7A is a vertical cross-sectional view of the exemplary structure after anisotropic etch of the first continuous semiconductor channel material layer and the continuous memory film layer and deposition of a second continuous semiconductor channel material layer and a conformal dielectric material layer according to an embodiment of the present disclosure.
Figure 7B:
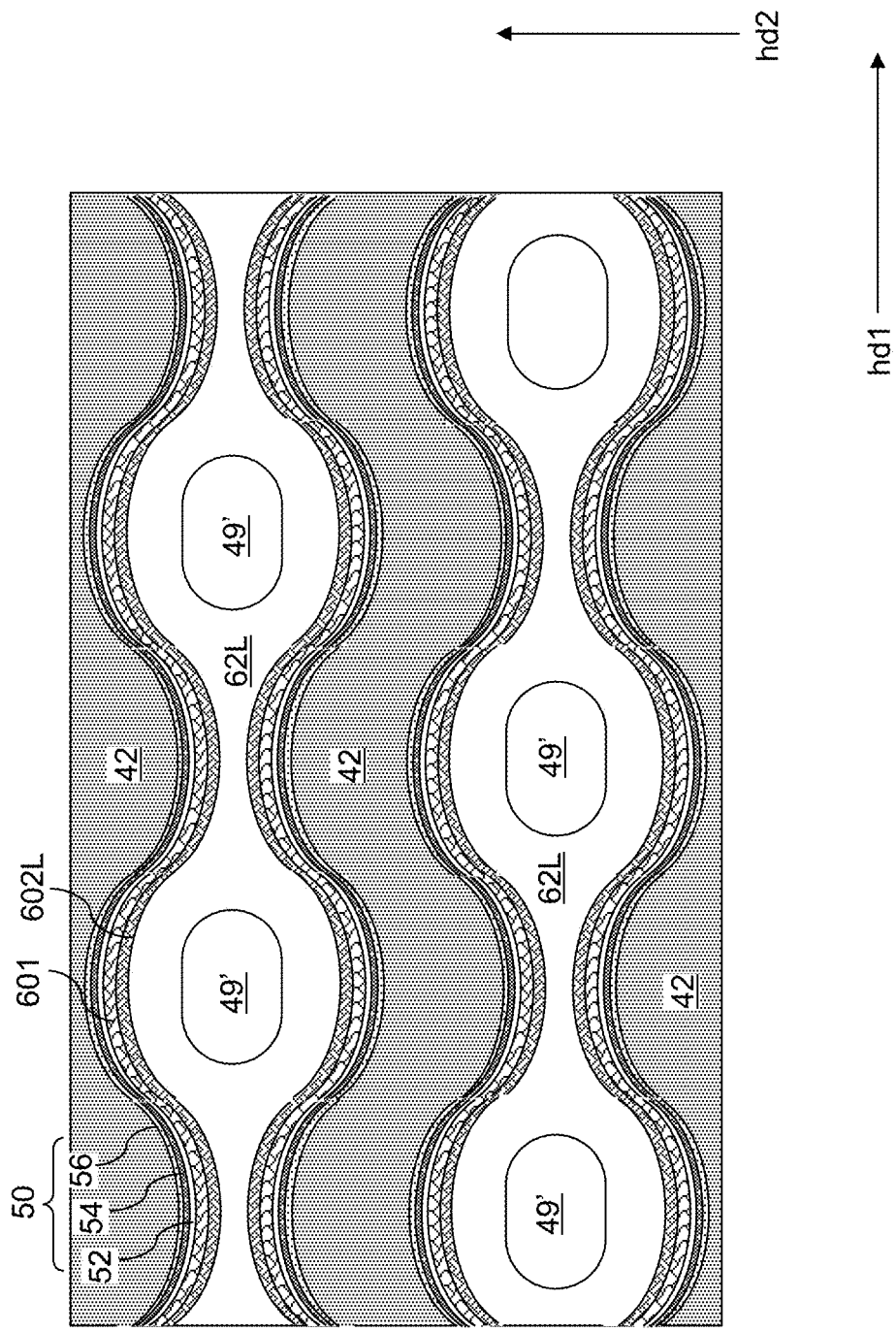
FIG. 7B is a horizontal cross-sectional view of the exemplary structure along the horizontal plane B-B' of FIG. 7A.

Referring to FIGS. 7A and 7B, horizontal portions of the optional first continuous semiconductor channel material layer 601L, the continuous tunneling dielectric layer 56L, the continuous charge storage layer 54L, and the continuous blocking dielectric layer 52L are sequentially anisotropically etched employing at least one anisotropic etch process. The etch chemistry of the at least one anisotropic etch process can be sequentially changed to etch horizontal portions of the various material layers. Each remaining portion of the optional first continuous semiconductor channel material layer 601L constitutes a first vertical semiconductor channel portion 601. Each remaining portion of the continuous tunneling dielectric layer 56L constitutes a tunneling dielectric 56. Each remaining portion of the continuous charge storage layer 54L constitutes a charge storage layer 54. Each remaining portion of the continuous blocking dielectric layer 52L constitutes a blocking dielectric 52. Each of the first vertical semiconductor channel portions 601, the tunneling dielectrics 56, the charge storage layers 54, and the blocking dielectrics 52 can have a tubular configuration, and can be topologically homeomorphic to a torus. As used herein, an element is topologically homeomorphic to a torus if the shape of the element can be continuously stretched without destroying a hole or forming a new hole into the shape of a torus. Each contiguous combination of a tunneling dielectric 56, a charge storage layer 54, and a blocking dielectric 52 constitutes a memory film 50.

A surface of a pedestal channel rail 11R (or a surface of the semiconductor material layer 10 in case the pedestal channel rails 11R are not employed) can be physically exposed underneath each opening through a stack of a memory film 50 and a first vertical semiconductor channel portion 601. Optionally, the physically exposed semiconductor surface at the bottom of each width-modulated line cavity 149' can be vertically recessed so that the recessed semiconductor surface underneath each width-modulated line cavity 149' is vertically offset from the topmost surfaces of the pedestal channel rails 11R (or of the semiconductor material layer 10 in case pedestal channel rails 11R are not employed) by a recess distance.

A second continuous semiconductor channel material layer 602L can be deposited directly on the semiconductor surface of the pedestal channel rail 11R (or the semiconductor material layer 10 if the pedestal channel rail 11R is omitted), and directly on the first vertical semiconductor channel portions 601. The second continuous semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second continuous semiconductor channel material layer 602L includes amorphous silicon or polysilicon. The second continuous semiconductor channel material layer 602L can be formed by a conformal deposition method such as low pressure chemical vapor deposition (LPCVD). The thickness of the second continuous semiconductor channel material layer 602L can be in a range from 2 nm to 10 nm, although lesser and greater thicknesses can also be employed. The second continuous semiconductor channel material layer 602L partially fills the width-modulated line cavity 149' in each width-modulated line trench 149.

The materials of the first vertical semiconductor channel portions 601 and the second continuous semiconductor channel material layer 602L are collectively referred to as a semiconductor channel material. In other words, the semiconductor channel material is a set of all semiconductor materials in the first vertical semiconductor channel portions 601 and the second continuous semiconductor channel material layer 602L.

A conformal dielectric material layer 62L is formed on the second continuous semiconductor channel material layer 602L. The conformal dielectric material layer 62L includes a dielectric material that can be isotropically etched selective to the material of the second continuous semiconductor channel material layer 602L. For example, the conformal dielectric material layer 62L can include doped silicate glass, undoped silicate glass, or organosilicate glass. The neck regions 149N of the width-modulated line trenches 149 are filled with the material of the conformal dielectric material layer 62L, while the bulbous regions 149B of the width-modulated line trenches 149 are not completely filled by the material of the conformal dielectric material layer 62L. Pillar cavities 49' that are not filled with the conformal dielectric material layer 62L are present in the bulbous regions 149B, while the conformal dielectric material layer 62L completely fills the neck regions 149N.

Figure 8A:
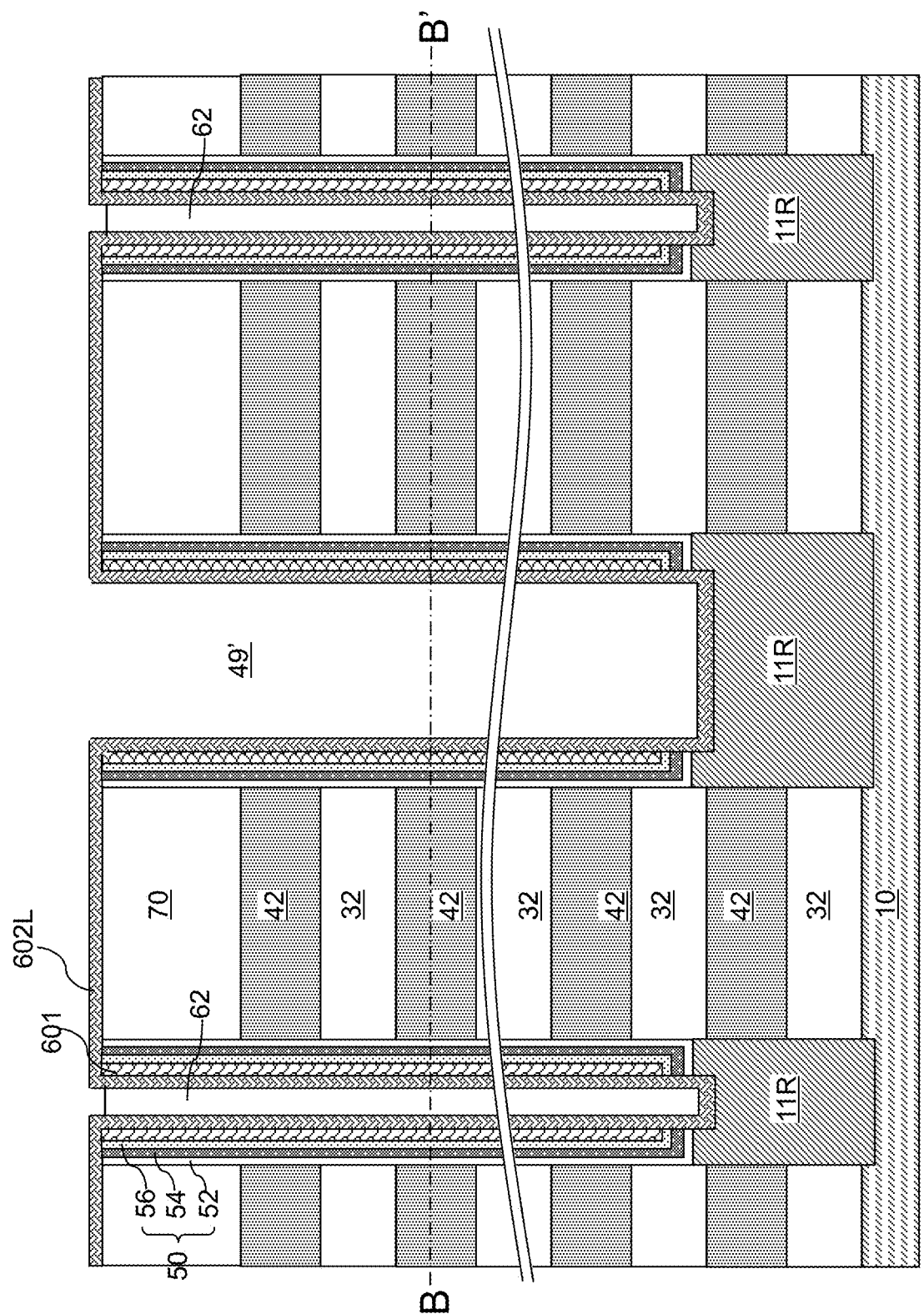
FIG. 8A is a vertical cross-sectional view of the exemplary structure after isotropic etch back of the conformal dielectric material layer according to an embodiment of the present disclosure.
Figure 8B:
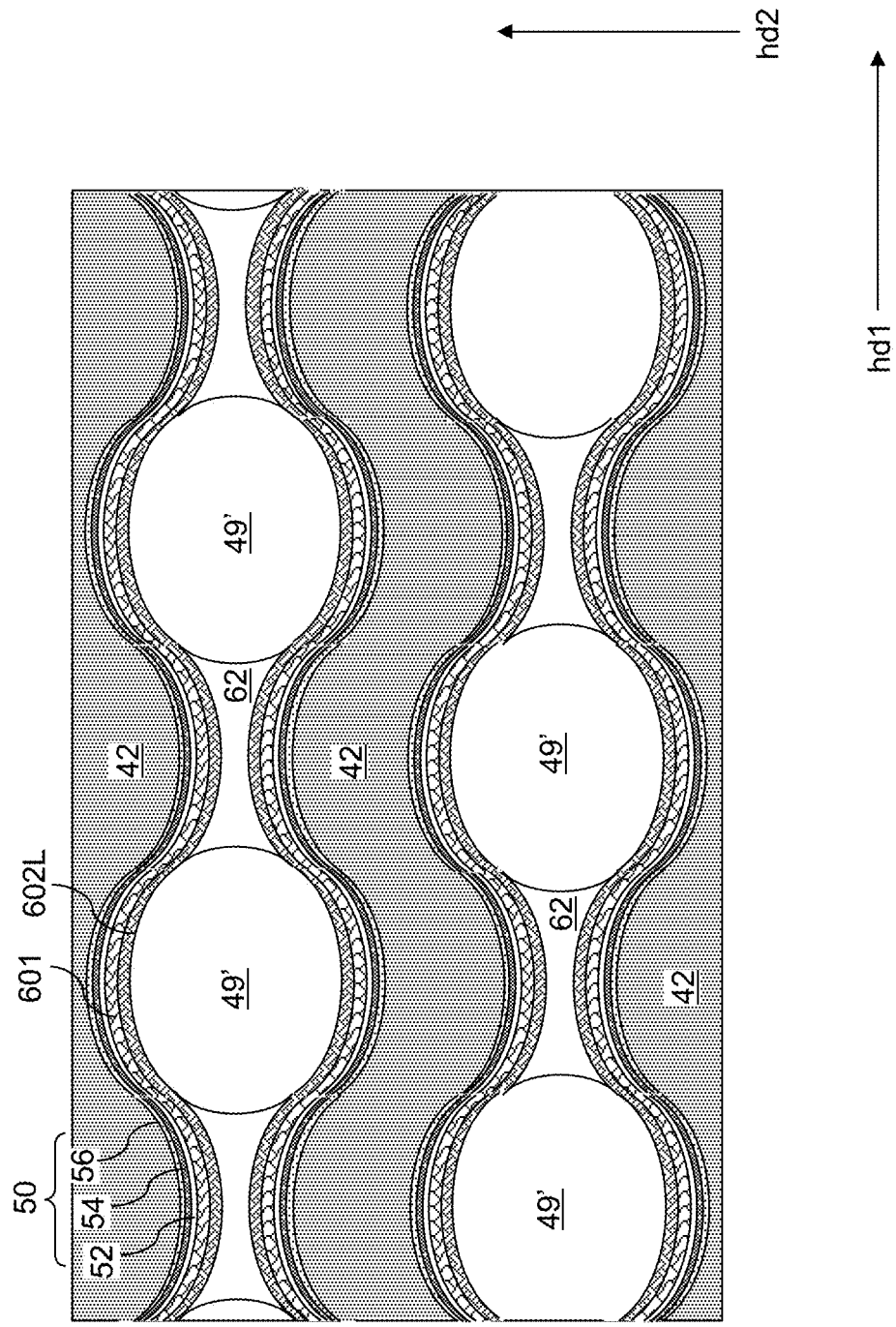
FIG. 8B is a horizontal cross-sectional view of the exemplary structure along the horizontal plane B-B' of FIG. 8A.

Referring to FIGS. 8A and 8B, a first etch process is performed, which etches back the material of the conformal dielectric material layer 62L. For example, a chemical dry etch process can be used to recess the conformal dielectric material layer 62L. The duration of the first etch process is selected such that the etch distance is in a range from 100% to 140%, such as from 100% to 120%, of the thickness of the conformal dielectric material layer 62L. Portions of the conformal dielectric material layer 62L in the bulbous regions 149B are removed without removing portions of the conformal dielectric material layer 62L in the neck regions 149N. Horizontal portions of the conformal dielectric material layer 62L are removed from above the insulating cap layer 70 and at the bottom of each pillar cavity 49'. Remaining portions of the conformal dielectric material layer 62L in the neck regions constitute dielectric cores 62 after the etch process. The pillar cavities 49' are laterally expanded by the etch process to physically expose surface portions of the second continuous semiconductor channel material layer 602L in the bulbous regions 149B.

Figure 9A:
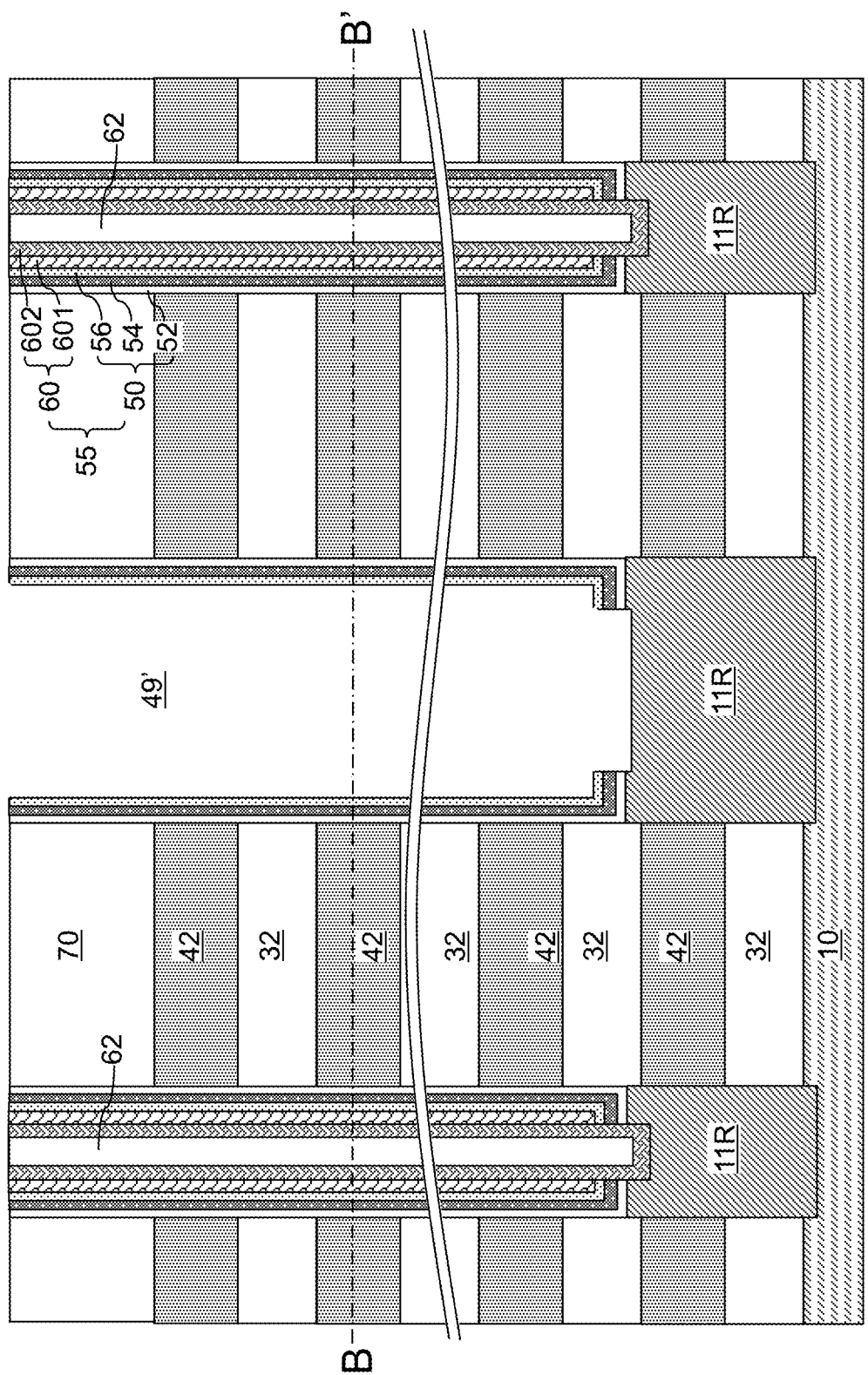
FIG. 9A is a vertical cross-sectional view of the exemplary structure after isotropic etching of the second continuous semiconductor channel material layer and first semiconductor channel layers according to an embodiment of the present disclosure.
Figure 9B:
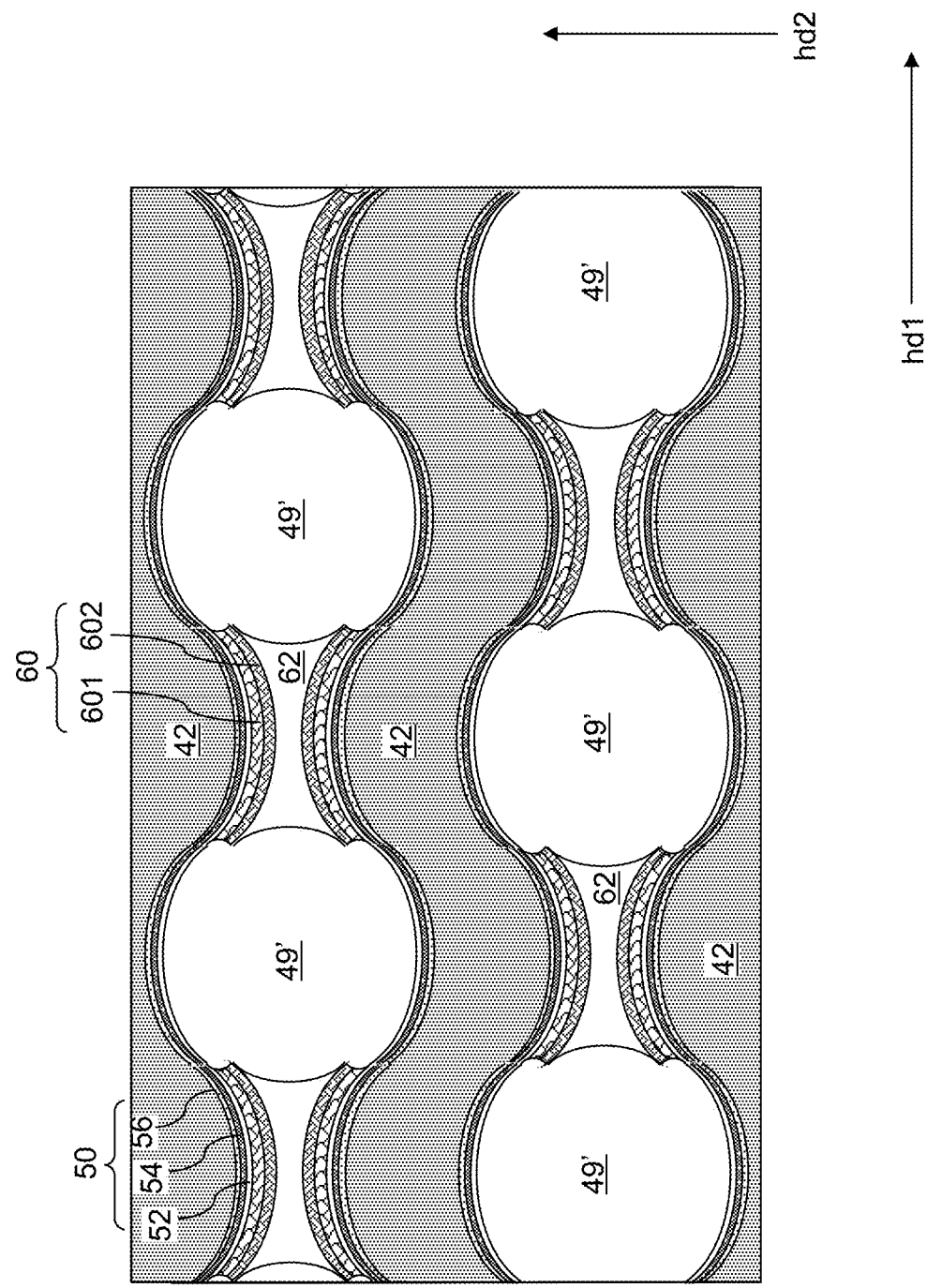
FIG. 9B is a horizontal cross-sectional view of the exemplary structure along the horizontal plane B-B' of FIG. 9A.

Referring to FIGS. 9A and 9B, a second etch process is performed, which etches the semiconductor channel material of the second continuous semiconductor channel material layer 602L and the first vertical semiconductor channel portions 601 selective to the material of the dielectric cores 62. The exposed semiconductor channel material in the bulbous regions 149B is removed, while the semiconductor channel material that is protected by the dielectric 62 cores in the neck regions 149N is not removed. In one embodiment, the chemistry of the second etch process can be selective to the materials of the memory films 50. For example, the second etch process can include a wet etch process employing hot trimethyl-2 hydroxyethyl ammonium hydroxide ("hot TMY") or tetramethyl ammonium hydroxide (TMAH). The duration of the second etch process can be selected such that the etch distance through the semiconductor channel material is at least the sum of the thickness of the second continuous semiconductor channel material layer 602L and the thickness of a first vertical semiconductor channel portion 601. In one embodiment, the etch distance through the semiconductor channel material is in a range from 100% to 140%, such as from 100% to 120%, of the sum of the thickness of the second continuous semiconductor channel material layer 602L and the thickness of a first vertical semiconductor channel portion 601.

The portions of the second continuous semiconductor channel material layer 602L and the first vertical semiconductor channel portions 601 that are not masked by the dielectric cores 62 in the bulbous regions 149B are removed by the second etch process. Each remaining portion of the second continuous semiconductor channel material layer 602L constitutes a second vertical semiconductor channel portion 602. Each remaining contiguous set of a second vertical semiconductor channel portion 602 and a first vertical semiconductor channel portion 601 constitutes a vertical semiconductor channel 60.

Each of the vertical semiconductor channels 60 includes a respective laterally-concave and vertically-planar outer sidewall that is formed directly on a laterally-convex and vertically-planar sidewall of a respective one of the memory films 50. Each of the vertical semiconductor channels 60 can be located in one of the neck regions of the width-modulated line trenches 149.

The memory films 50 can remain on a respective sidewall of the alternating stacks (32, 42) in both the bulbous regions 149B and the neck regions 149N. Thus, the memory films 50 are continuous throughout the entire width-modulated line trenches 149, while the semiconductor channels 60 remain only in the neck regions 149N. Each of the memory films 50 generally extends along the first horizontal direction hd1, and laterally undulates along the second horizontal direction hd2. Each of the memory films 50 includes a respective layer stack (52, 54, 56) that comprises a blocking dielectric 52 that contacts a respective one of the alternating stacks (32, 42), a charge storage layer 54 contacting the blocking dielectric 52, and a tunneling dielectric 56 contacting the charge storage layer 54. A row of discrete vertical semiconductor channels 60 is located within the neck regions 149N of a respective width-modulated line trench 149.

Figure 10A:
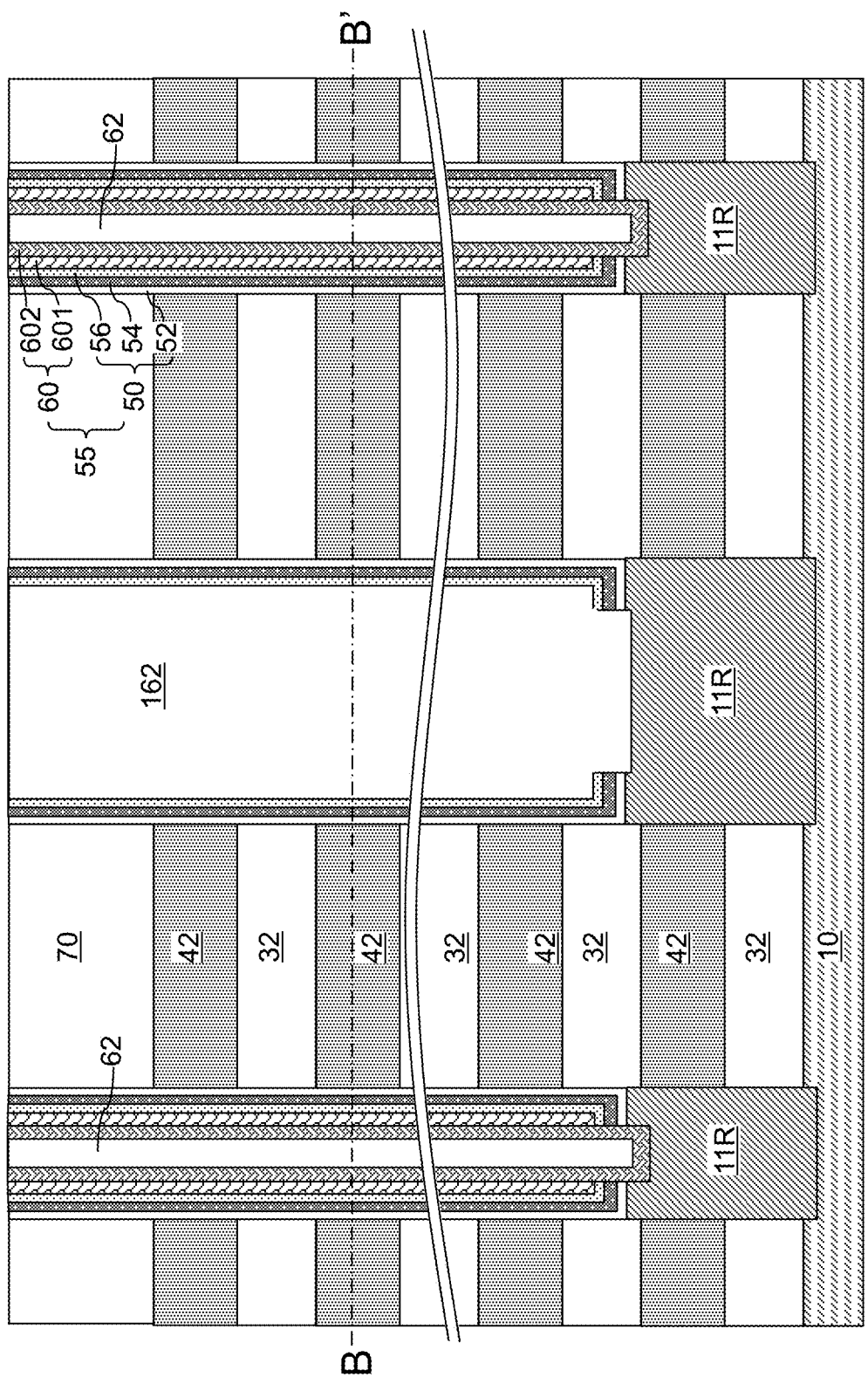
FIG. 10A is a vertical cross-sectional view of the exemplary structure after formation of dielectric pillar structures according to an embodiment of the present disclosure.
Figure 10B:
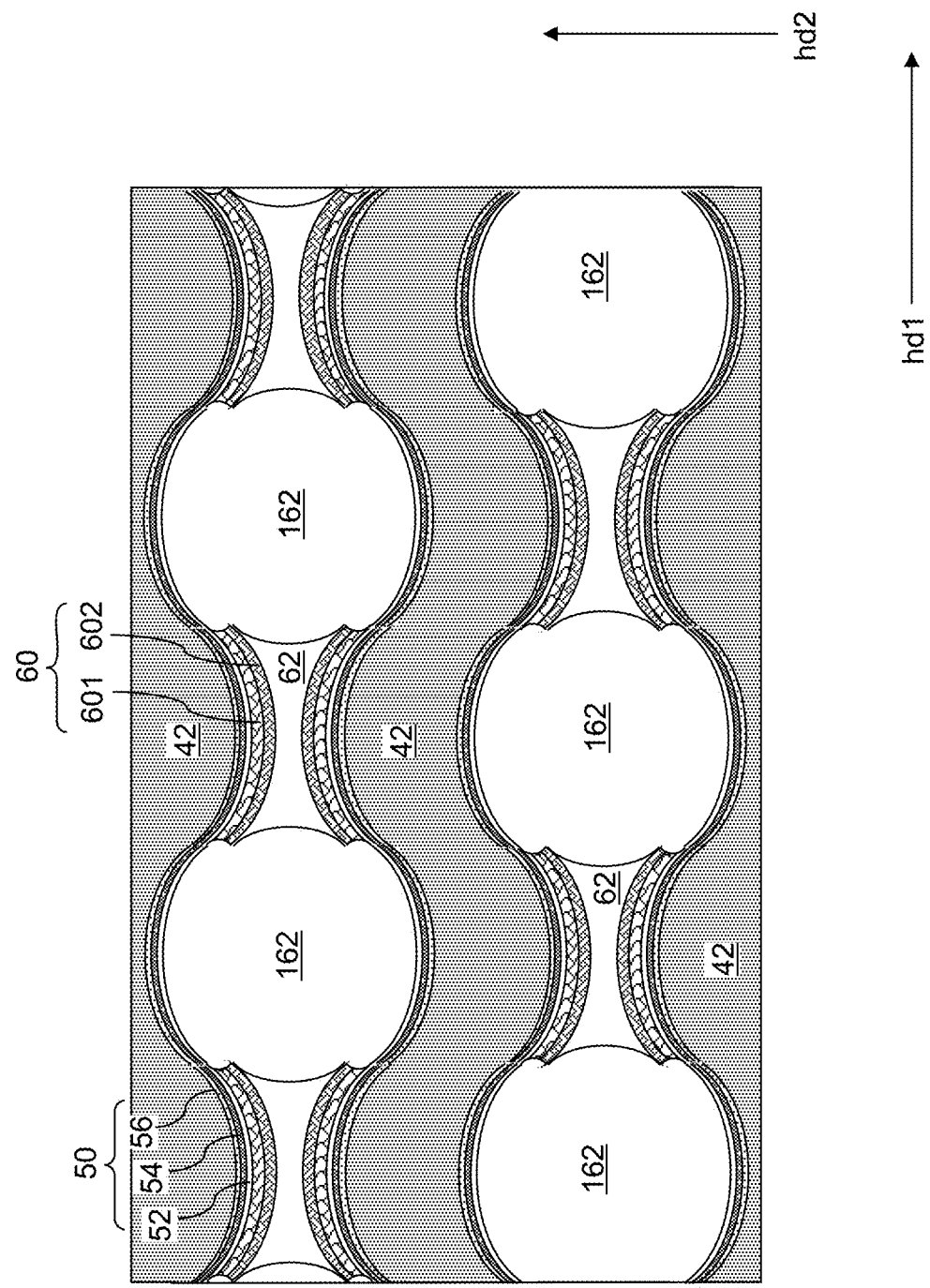
FIG. 10B is a horizontal cross-sectional view of the exemplary structure along the horizontal plane B-B' of FIG. 10A.
Figure 11A:
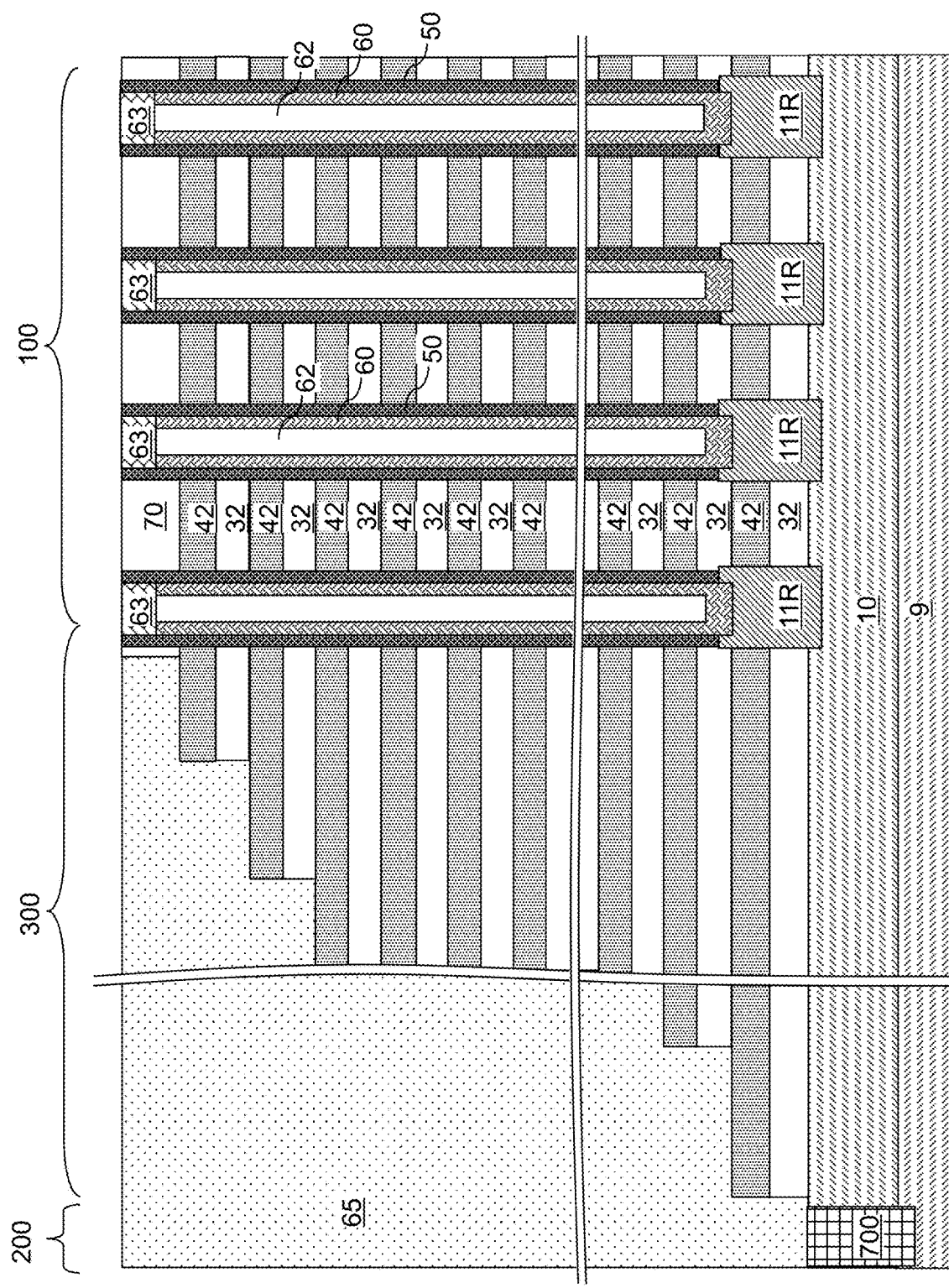
FIG. 11A is a vertical cross-sectional view of the exemplary structure after formation of drain regions according to an embodiment of the present disclosure.
Figure 11B:
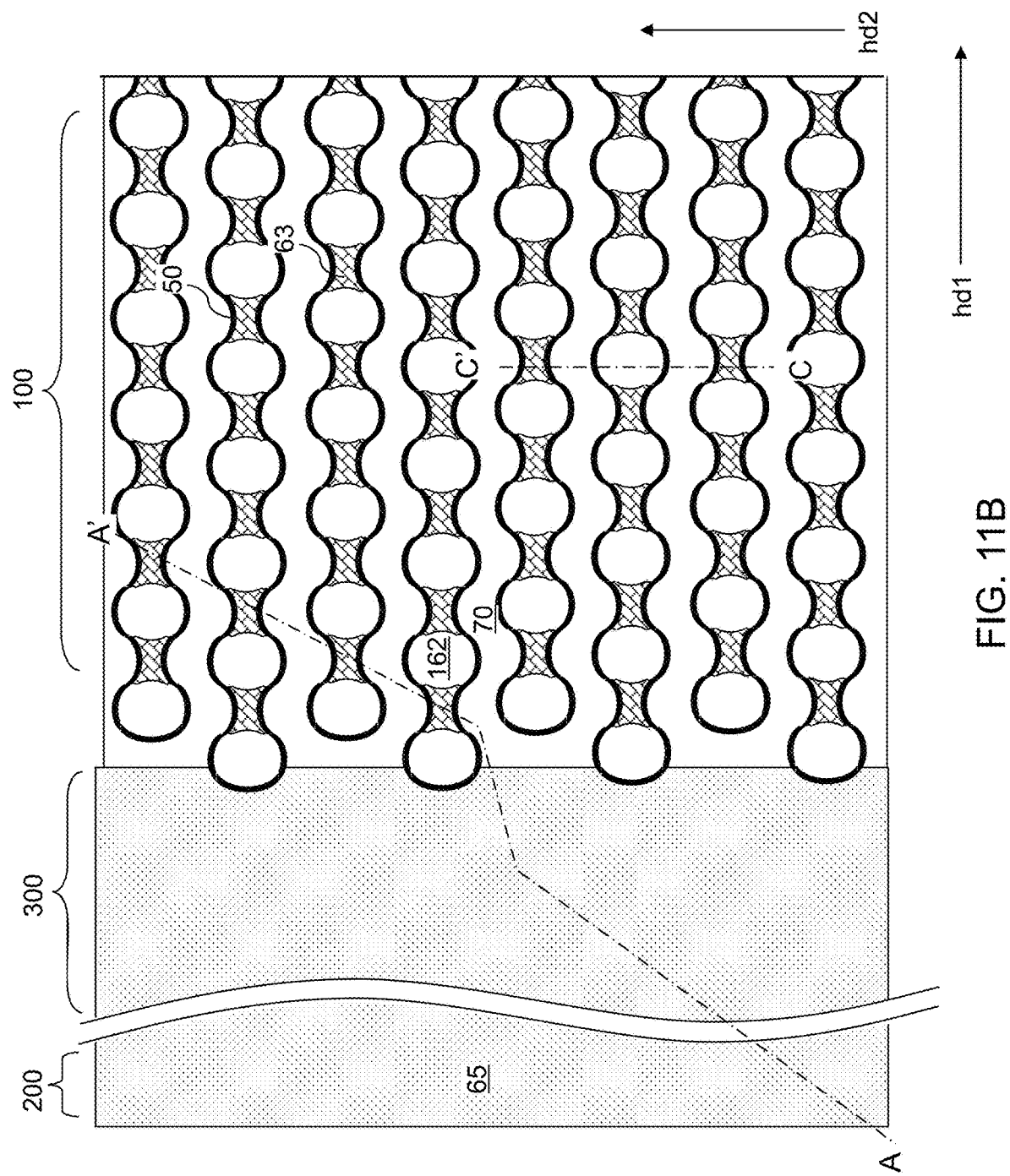
FIG. 11B is a top-down view of the exemplary structure of FIG. 11A. The hinged vertical plane A-A' is the plane of the vertical cross-section of FIG. 11A.
Figure 11C:
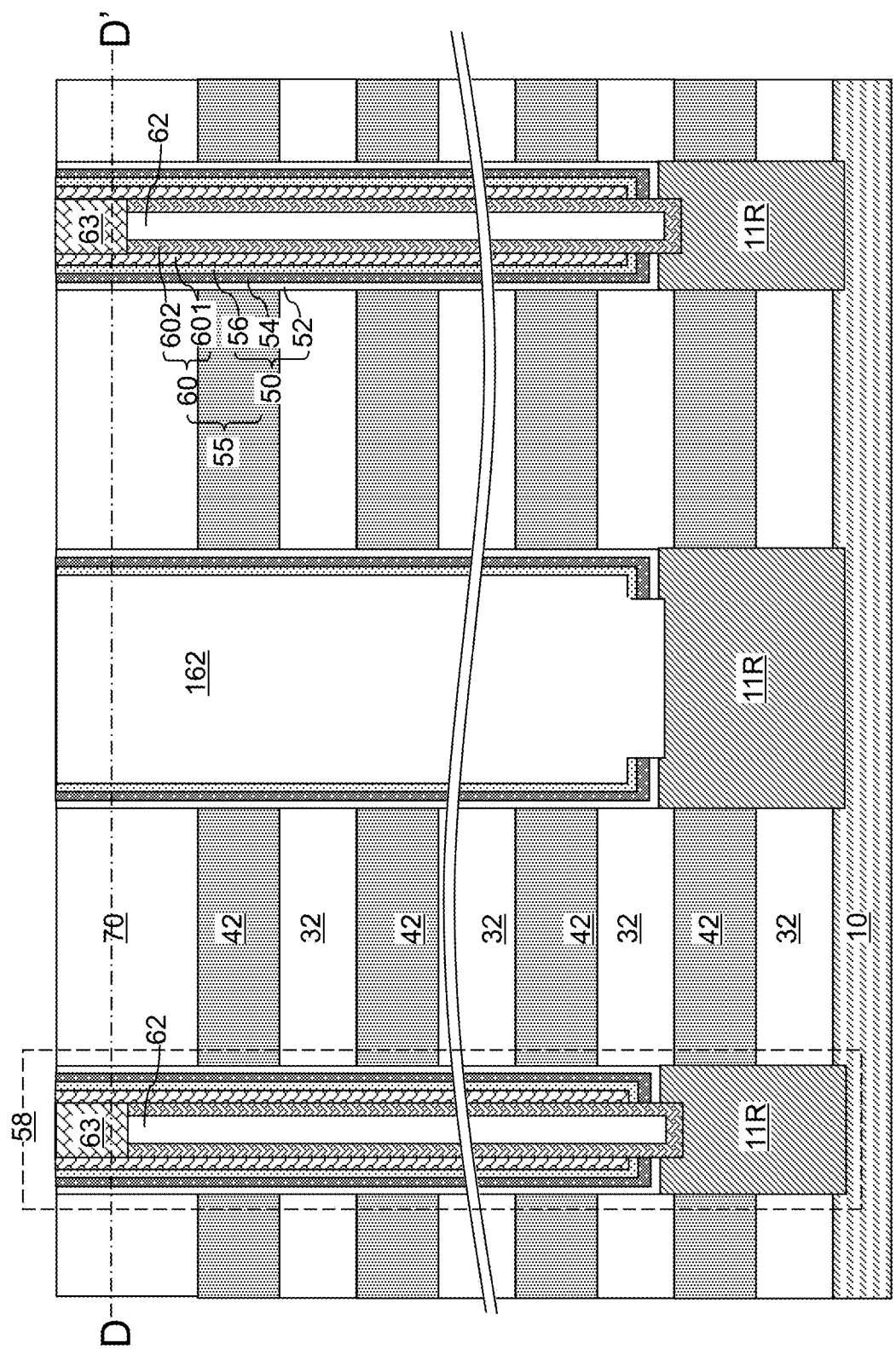
FIG. 11C is a vertical cross-sectional view of the exemplary structure along the vertical plane C-C' of FIG. 11B.
Figure 11D:
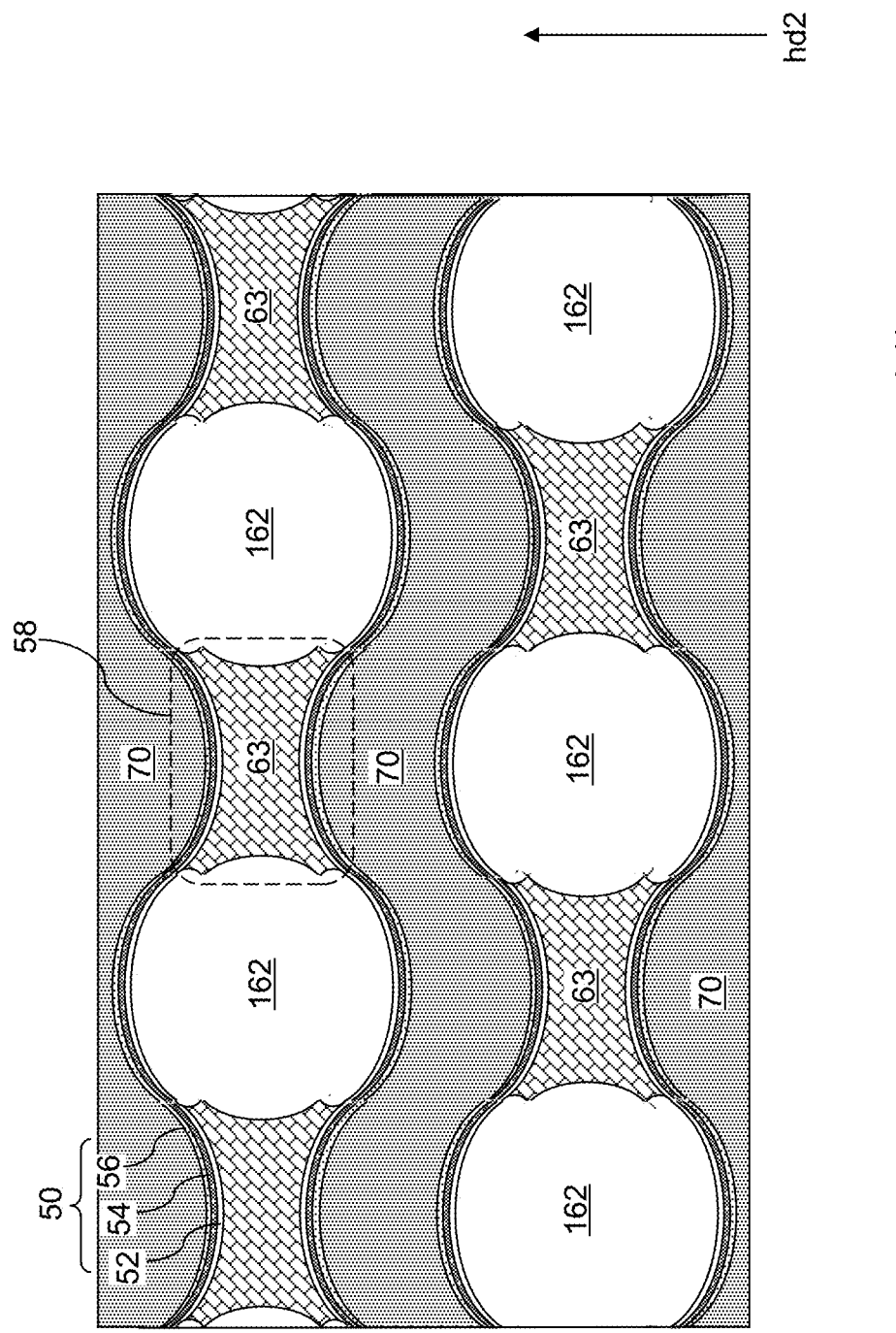
FIG. 11D is a horizontal cross-sectional view of the exemplary structure along the horizontal plane D-D' of FIG. 11C.

Referring to FIGS. 10A and 10B, dielectric pillar structures 162 are formed in the pillar cavities 49'. Specifically, a dielectric material can be formed in the pillar cavities 49' after forming the vertical semiconductor channels 60 by deposition and planarization of the dielectric material. The dielectric material can include, for example, undoped silicate glass, doped silicate glass, or organosilicate glass. Excess portions of the dielectric material can be removed from above the horizontal plane including the top surfaces of the insulating cap layer 70 by a recess etch.

The dielectric pillar structures 162 can be formed as a two-dimensional array of dielectric pillar structures 162 that are located within the bulbous regions of the width-modulated line trenches 149. In one embodiment, each of the dielectric pillar structures 162 includes a pair of first laterally-convex and vertically-planar sidewalls that contact a respective pair of memory films 50. In one embodiment, each of the dielectric pillar structures 162 includes a pair of second laterally-convex and vertically-planar sidewalls that contact a respective pair of dielectric cores 62. In one embodiment, each of the width-modulated line trenches 149 includes a laterally alternating sequence of dielectric cores 62 and dielectric pillar structures 162, and each interface between a neighboring pair of a dielectric core 62 and a dielectric pillar structure 162 includes a surface at which a laterally convex-sidewall of the dielectric pillar structure 162 contacts a laterally-concave sidewall of the dielectric core 62. Thus, the dielectric pillar structure 162 and memory films 50 remain in the bulbous regions 149B, while the semiconductor channels 60, the memory films 50 and the dielectric cores remain in the neck regions 149N.

Referring to FIGS. 11A-11D, the dielectric cores 62 can be vertically recessed without recessing at least a center region of each dielectric pillar structure 162. For example, a photoresist layer can be applied over the exemplary structure and can be lithographically patterned to provide openings in areas of the dielectric cores 62 and optionally in areas around the dielectric cores 62. The dielectric cores 62 can be vertically recessed through openings in the photoresist layer by an anisotropic etch process. The depth of the recess can be selected such that the recessed surfaces of the dielectric cores 62 are located between a horizontal plane including the top surfaces of the insulating cap layer 70 and a horizontal plane including the bottom surfaces of the insulating cap layer 70. The photoresist layer can be subsequently removed, for example, by ashing.

A doped semiconductor material having a doping of a second conductivity type is formed in the recessed regions between neighboring pairs of vertical semiconductor channels 60. The second conductivity type is the opposite of the first conductivity type. The doped semiconductor material can include electrical dopants of the second conductivity type (e.g., n-type) at an atomic concentration in a range from $5.0 \times 10^{19}/cm^3$ to $1.0 \times 10^{21}/cm^3$. The dopants can be provided in-situ during deposition and/or by ion implantation after deposition of the semiconductor material. Portions of the deposited doped semiconductor material of the second conductivity type that overlie the horizontal plane including the top surfaces of the patterned portions of the insulating cap layer 70 can be removed by a planarization process, which can be a recess etch that etches the semiconductor materials selective to the dielectric material of the insulating cap layer 70 or a chemical mechanical planarization (CMP) process. Each remaining portion of the doped semiconductor material of the second conductivity type constitutes a drain region 63. The structures located within the neck regions 149N of the width-modulated line trenches 149 are herein referred to as a memory opening fill structure 58. Each memory opening fill structure 58 includes a portion of an optional pedestal channel rail 11R, a pair of memory films 50, a pair of vertical semiconductor channels 60, a dielectric core 62, and a drain region 63.

Figure 12A:
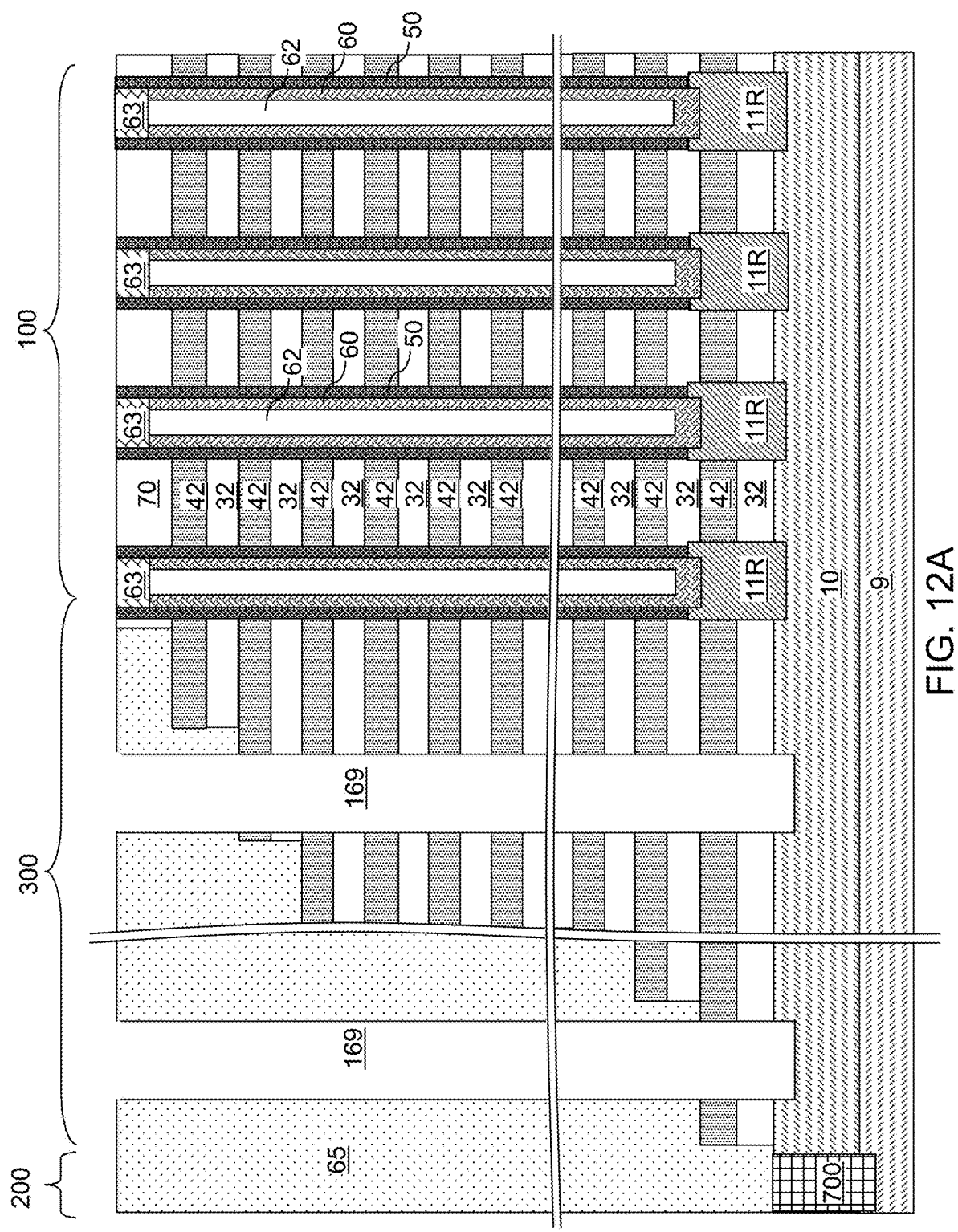
FIG. 12A is a vertical cross-sectional view of the exemplary structure after formation of via cavities according to an embodiment of the present disclosure.
Figure 12B:
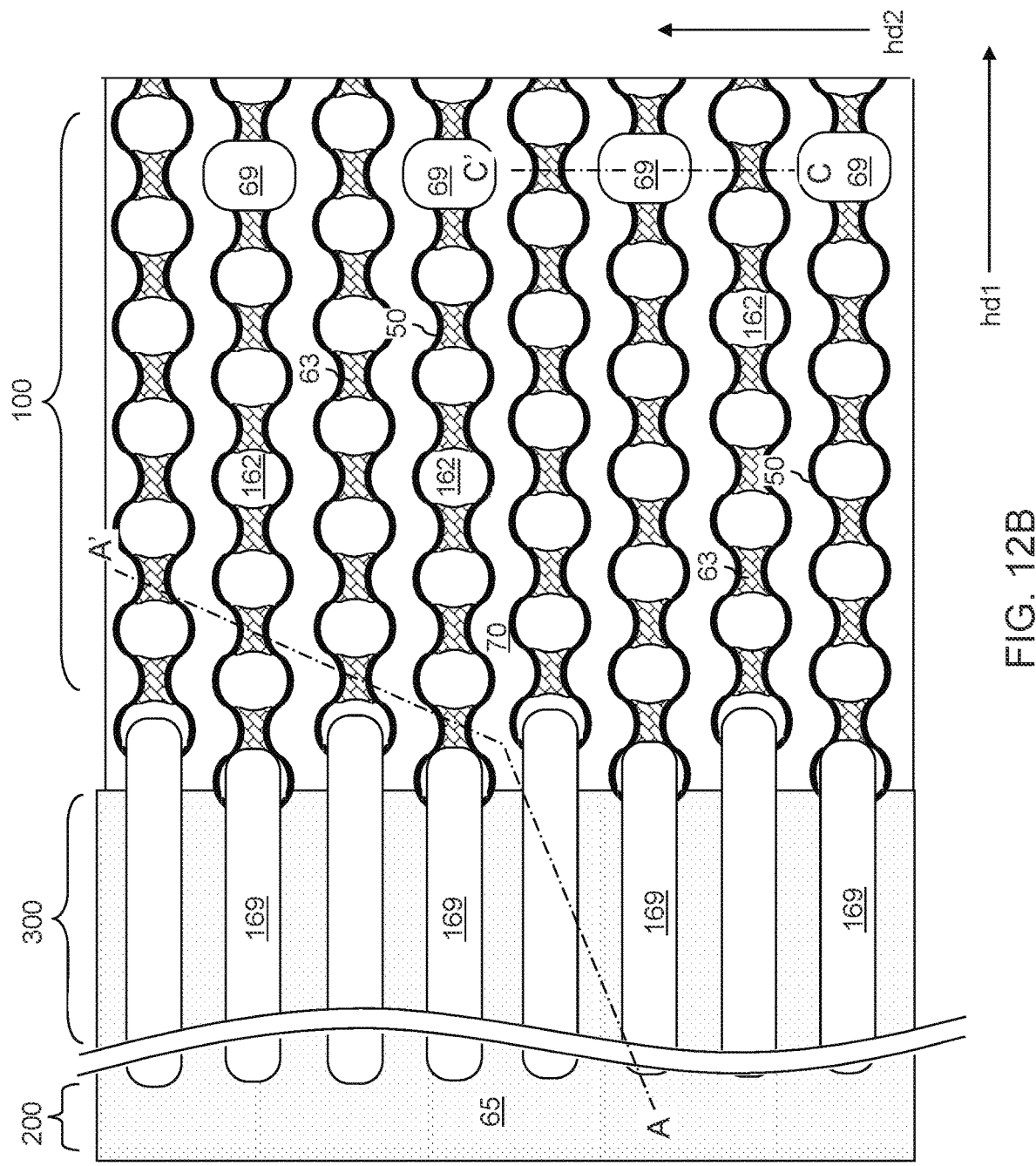
FIG. 12B is a top-down view of the exemplary structure of FIG. 12A. The hinged vertical plane A-A' is the plane of the vertical cross-section of FIG. 12A.
Figure 12C:
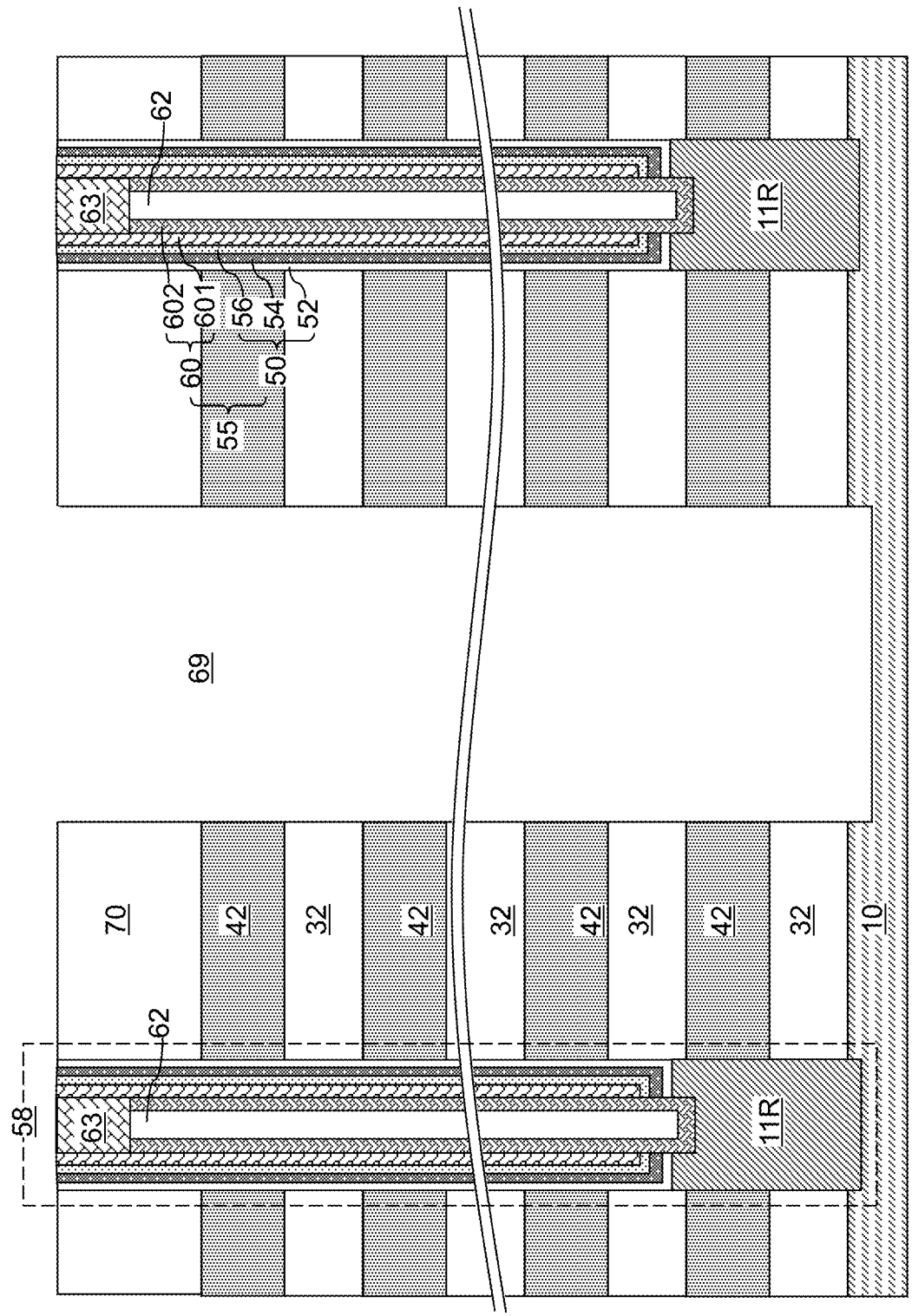
FIG. 12C is a vertical cross-sectional view of the exemplary structure along the vertical plane C-C' of FIG. 12B.

Referring to FIGS. 12A-12C, at least one of backside via cavities 69 and/or elongated backside trenches 169 are formed. The backside via cavities 69 can be formed in discrete locations that intersect the width-modulated line trenches 149 while the elongated backside trenches 169 are formed through portions of the line trenches 149 located in the contact region 300. For example, a photoresist layer can be applied over the exemplary structure, and can be lithographically patterned to form openings in at least one of areas of a subset of the dielectric pillar structures 162 within the memory array region 100 and/or in areas corresponding to lateral extensions of the width-modulated line trenches 149 into the contact region 300. An anisotropic etch is performed through the level of the insulating cap layer 70 and through each level of the sacrificial material strips 42. In one embodiment, the anisotropic etch can form cavities (69, 169) that extend through the entire thickness of the alternating stacks (32, 42). The backside via cavities 69 are formed in the memory array region 100 in, and around, the areas of the subset of the dielectric pillar structures 162. The elongated backside trenches 169 are formed in the contact region 300 in, and around, the areas that correspond to the extensions of the width-modulated line trenches 149 into the contact region 300. The elongated backside trenches 169 may have straight sidewalls that laterally extend along the first horizontal direction hd1.

The backside via cavities 69 can have substantially vertical sidewalls, and extend through the subset of the dielectric pillar structures 162 and through portions of the memory films 50. In one embodiment, the subset of the dielectric pillar structures 162 may be partially or completely removed upon formation of the backside via cavities 69. Portions of the pedestal channel rails 11R that underlie the subset of the dielectric pillar structures 162 can be removed. Portions of the memory films 50 exposed in the backside via cavities 69 can be removed to physically exposed sidewalls of the alternating stacks (32, 42). Sidewalls of the sacrificial material strips 42 of a neighboring pair of alternating stacks (32, 42) that are physically exposed backside via cavities 69. The bottom surfaces of the backside via cavities 69 can be at, or below, the horizontal plane including the bottommost surfaces of the sacrificial material strips 42 in each backside via cavity 69. In one embodiment, the backside via cavities 69 can be formed at regular intervals along the first horizontal direction hd1 for each of the line trenches 149.

The elongated backside trenches 169 laterally extend along the first horizontal direction hd1 in the contact region 300. In an alternative embodiment in which the width-modulated line trenches 149 do not completely divide the vertically alternating sequence of the insulating layers 32L and the sacrificial material layers 42L into discrete alternating stacks (32, 42) of insulating strips 32 and sacrificial material strips 42 at the processing steps of FIGS. 4A and 4B, the elongated backside trenches 169 may divide the vertically alternating sequence of the insulating layers 32L and the sacrificial material layers 42L into discrete alternating stacks (32, 42) of insulating strips 32 and sacrificial material strips 42 at this processing step. Sidewalls of the sacrificial material strips 42 within a neighboring pair of alternating stacks (32, 42) are physically exposed at each level of the sacrificial material strips 42 around each elongated backside trench 169. The bottom surfaces of the elongated backside trenches 169 can be at, or below, the horizontal plane including the bottommost surfaces of the sacrificial material strips 42.

The width-modulated line trenches 149 can be modified by the backside via cavities 69 and the elongated backside trenches 169. The widths of the backside via cavities 69 and the elongated backside trenches 169 can be greater than the maximum width of the width-modulated line trenches 149 prior to formation of the backside via cavities 69 and the elongated backside trenches 169 to ensure that sidewalls of the sacrificial material strips 42 are physically exposed on both sides of each of the backside via cavities 69 and the elongated backside trenches 169.

Figure 13:
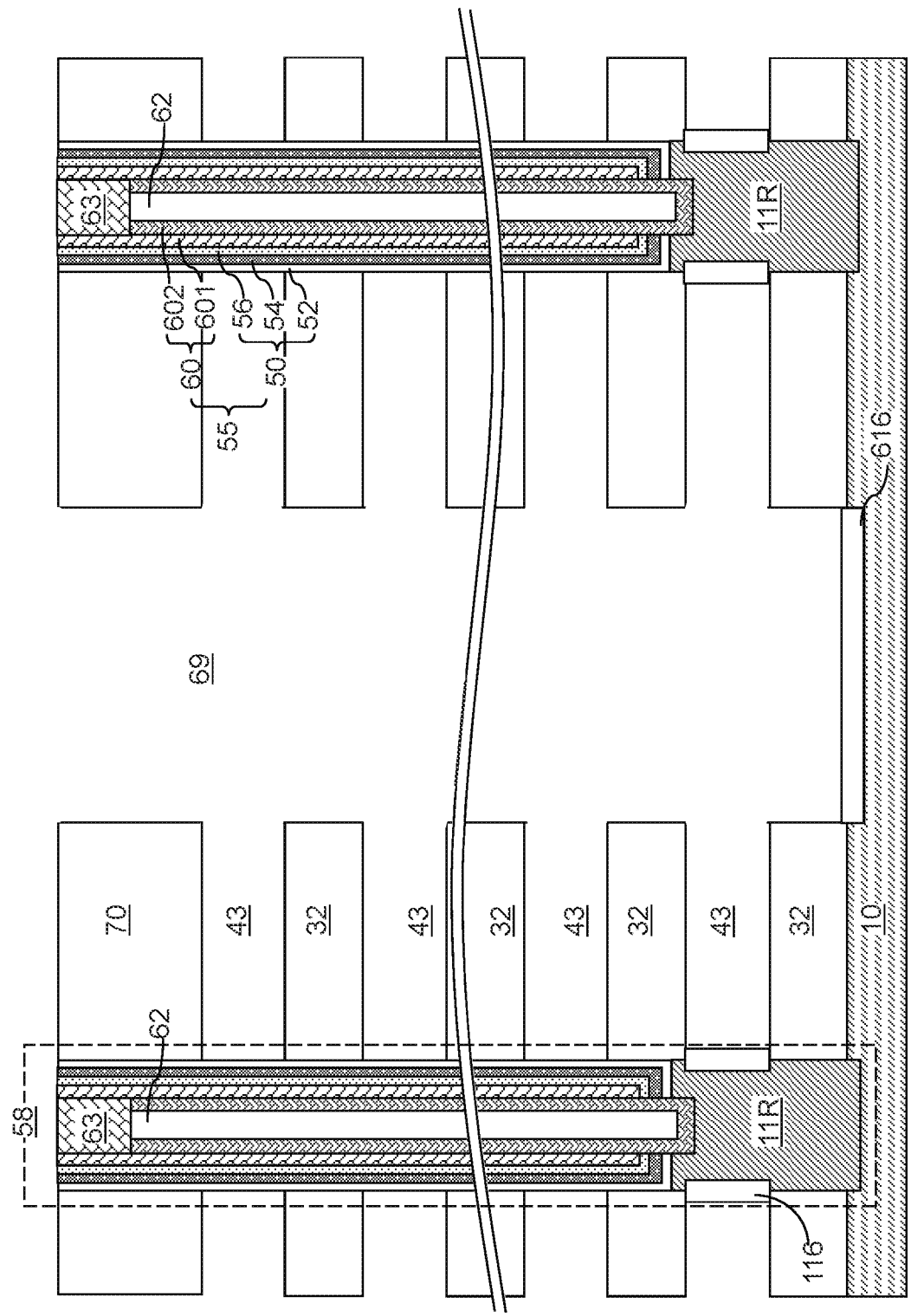
FIG. 13 is a vertical cross-sectional view of the exemplary structure after formation of backside recesses, conformal dielectric spacers, and planar dielectric portions according to an embodiment of the present disclosure.

Referring to FIG. 13, an etchant that selectively etches the second material of the sacrificial material strips 42 with respect to the first material of the insulating strips 32 can be introduced into the backside via cavities 69 and the elongated backside trenches 169, for example, employing an etch process. Backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the semiconductor material of the semiconductor material layer 10, and the material of the outermost layer of the memory films 50. In one embodiment, the sacrificial material strips 42 can include silicon nitride, and the materials of the insulating strips 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside via cavities 69 and the elongated backside trenches 169. For example, if the sacrificial material strips 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each backside recess 43 can be a laterally undulating cavity having a lateral dimension that is greater than the vertical extent of the cavity along the first horizontal direction hd1. In other words, the lateral dimension of each backside recess 43 along the first horizontal direction hd1 can be greater than the height of the backside recess 43. A plurality of backside recesses 43 can be formed in the volumes from which the second material of the sacrificial material strips 42 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating strip 32 and a bottom surface of an overlying insulating strip 32. In one embodiment, each backside recess 43 can have a uniform height throughout.

Physically exposed surface portions of the optional pedestal channel rails 11R and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel rail 11R into a conformal dielectric spacer 116, and to convert each physically exposed surface portion of the semiconductor material layer 10 into a planar dielectric portion 616. The conformal dielectric spacers 116 include a dielectric material that includes the same semiconductor element as the pedestal channel rails 11R and additionally includes at least one non-metallic element such as oxygen and/or nitrogen such that the material of the conformal dielectric spacers 116 is a dielectric material. In one embodiment, the conformal dielectric spacers 116 can include a dielectric oxide, a dielectric nitride, or a dielectric oxynitride of the semiconductor material of the pedestal channel rails 11R. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 14:
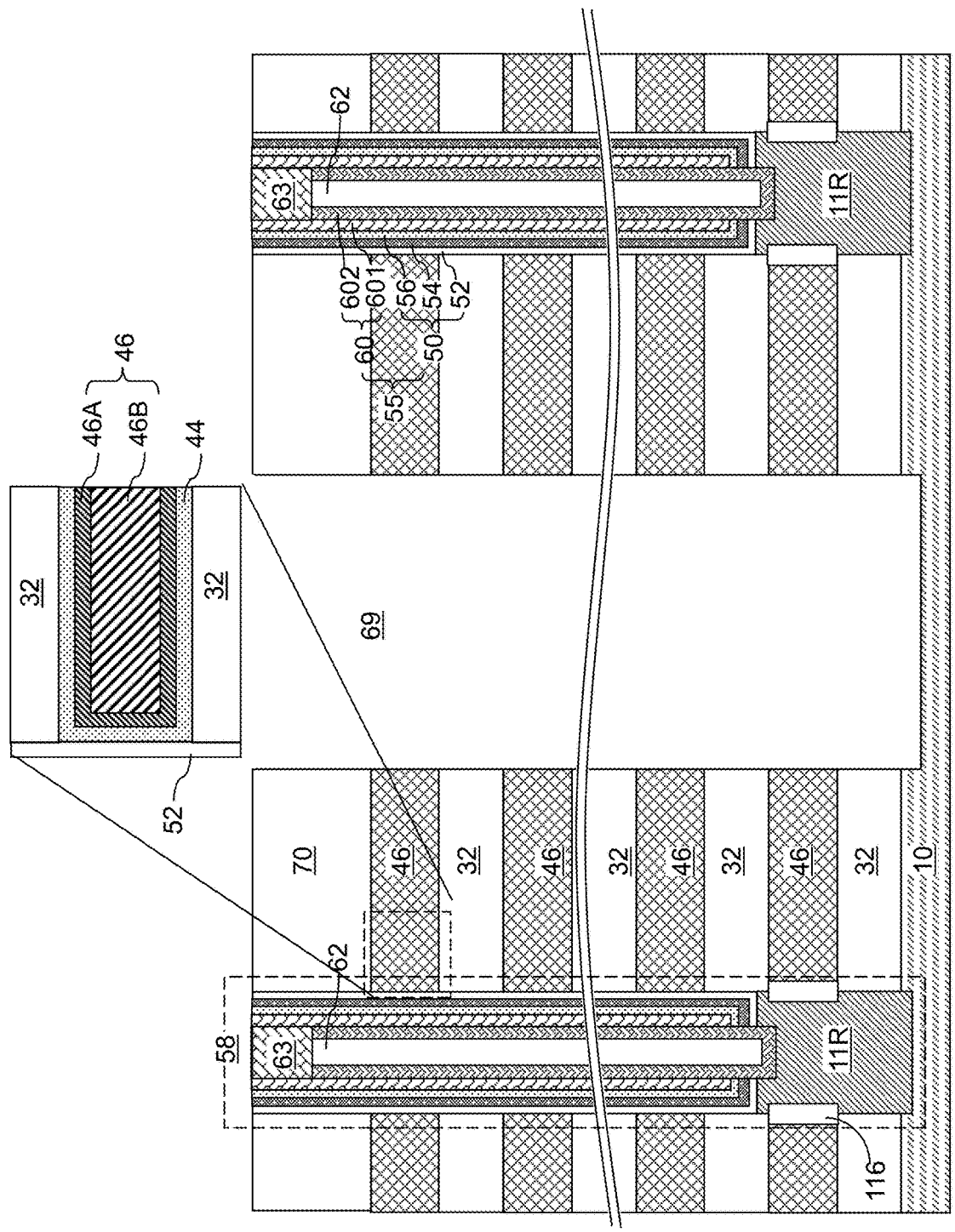
FIG. 14 is a vertical cross-sectional view of the exemplary structure after formation of electrically conductive strips according to an embodiment of the present disclosure.

Referring to FIG. 14, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive strips to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside via cavities 69 and the elongated backside trenches 169. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of each backside via cavity 69 and each elongated backside trench 169, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating strips 32 and the memory stack structures 55 by the metallic barrier layer 46A, which is a metallic barrier layer that blocks diffusion of fluorine atoms therethrough.

A plurality of electrically conductive strips 46 can be formed in the plurality of backside recesses 43, and a continuous metallic material layer can be formed on the sidewalls of each backside via cavity 69 and each elongated backside trench 169 and over the insulating cap layer 70. Each electrically conductive strip 46 includes a portion of the metallic barrier layer 46A and a portion of the metallic fill material layer 46B that are located between a vertically neighboring pair of dielectric material layers such as a pair of insulating strips 32. The continuous metallic material layer includes a continuous portion of the metallic barrier layer 46A and a continuous portion of the metallic fill material layer 46B that are located in the backside via cavities 69 and the elongated backside trenches 169 or above the insulating cap layer 70.

The deposited metallic material of the continuous electrically conductive material layer is etched back from the sidewalls of each backside via cavity 69 and each elongated backside trench 169 and from above the insulating cap layer 70, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 55. In other words, each electrically conductive strip 46 can be a word line that functions as a common control gate electrode, or a select gate electrode, for the plurality of vertical memory devices.

Figure 15:
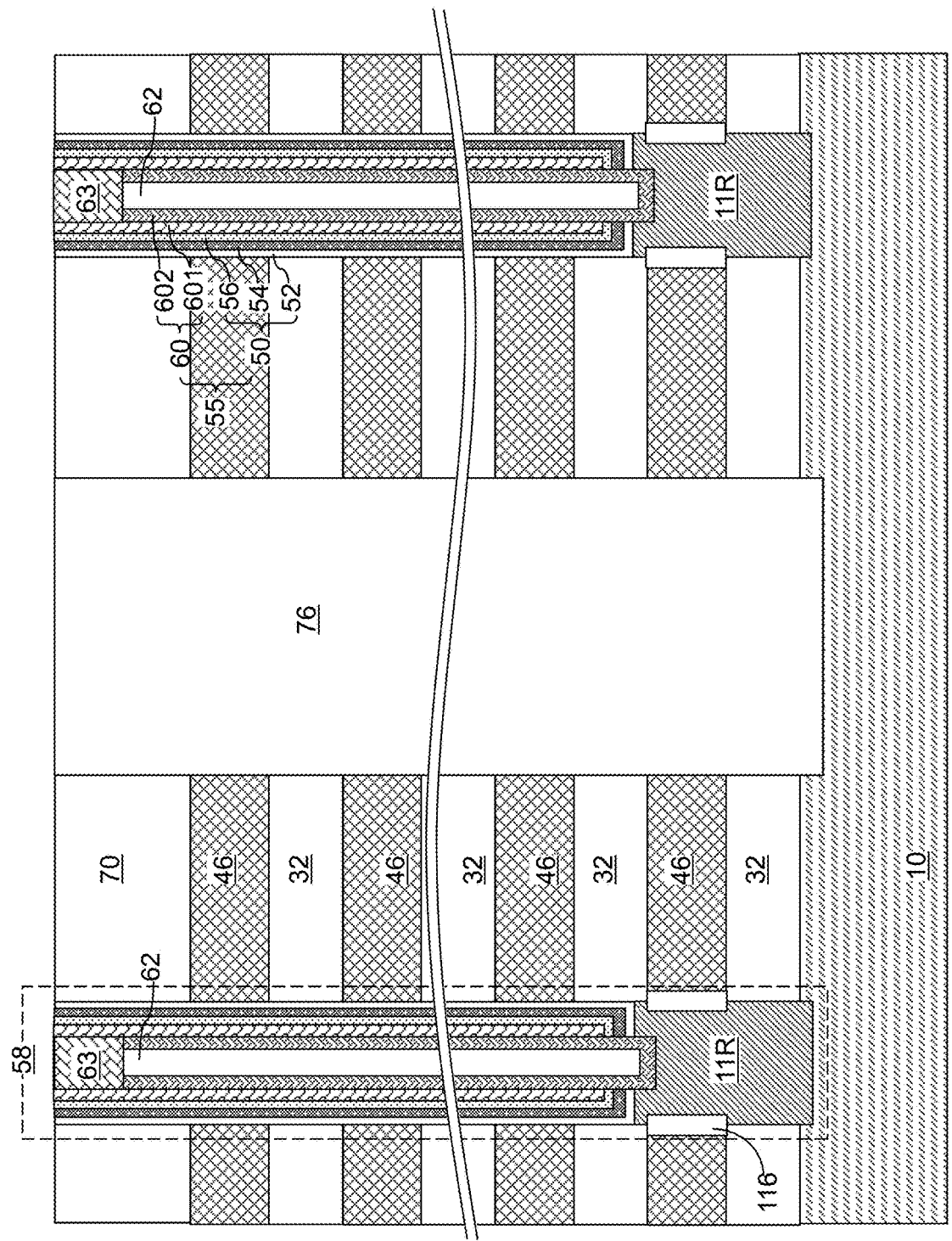
FIG. 15 is a vertical cross-sectional view of the exemplary structure after formation of source regions, insulating spacers, and source contact via structures according to an embodiment of the present disclosure.
Figure 16A:
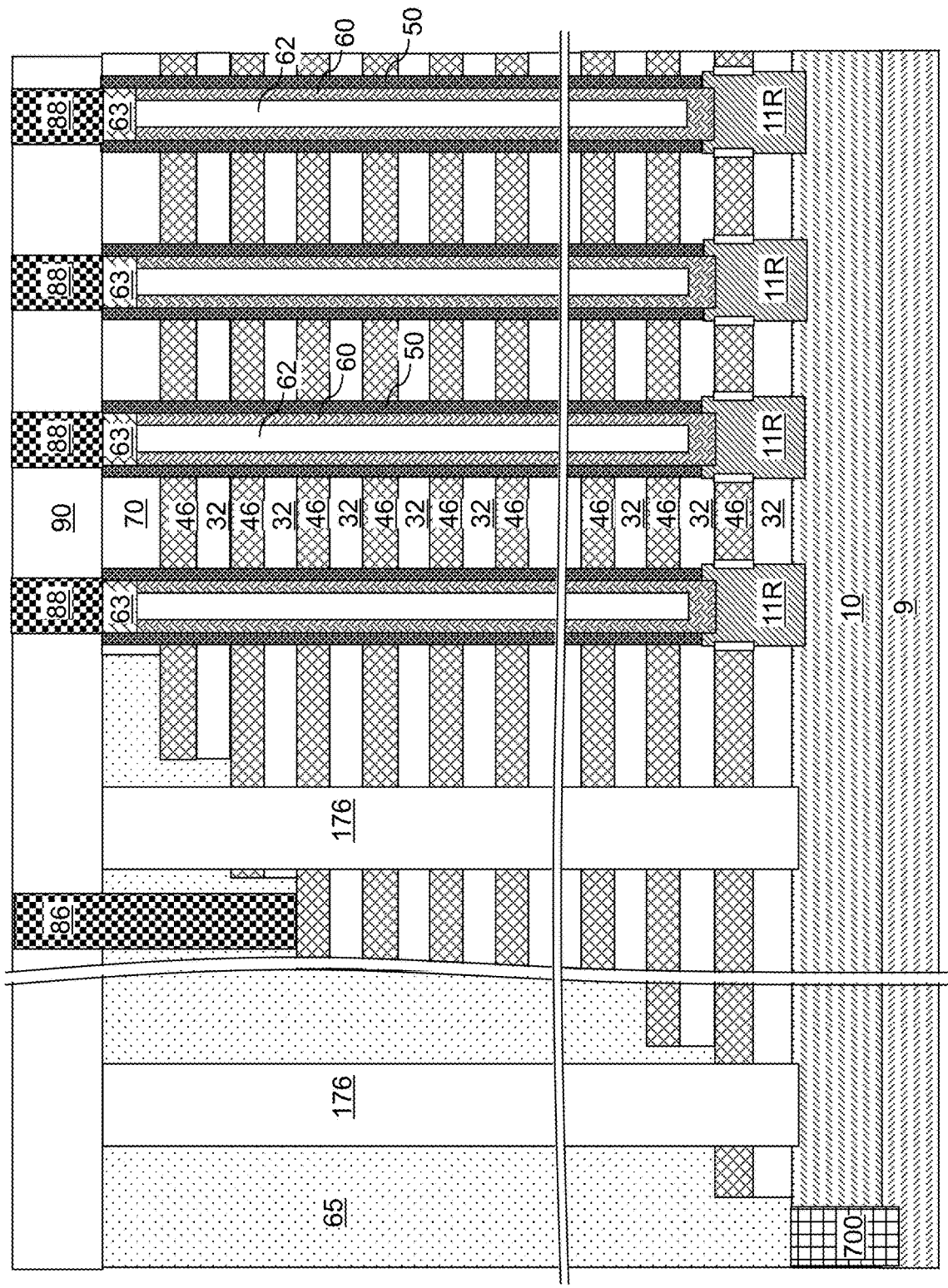
FIG. 16A is a vertical cross-sectional view of the exemplary structure after formation of additional contact via structures according to an embodiment of the present disclosure.
Figure 16B:
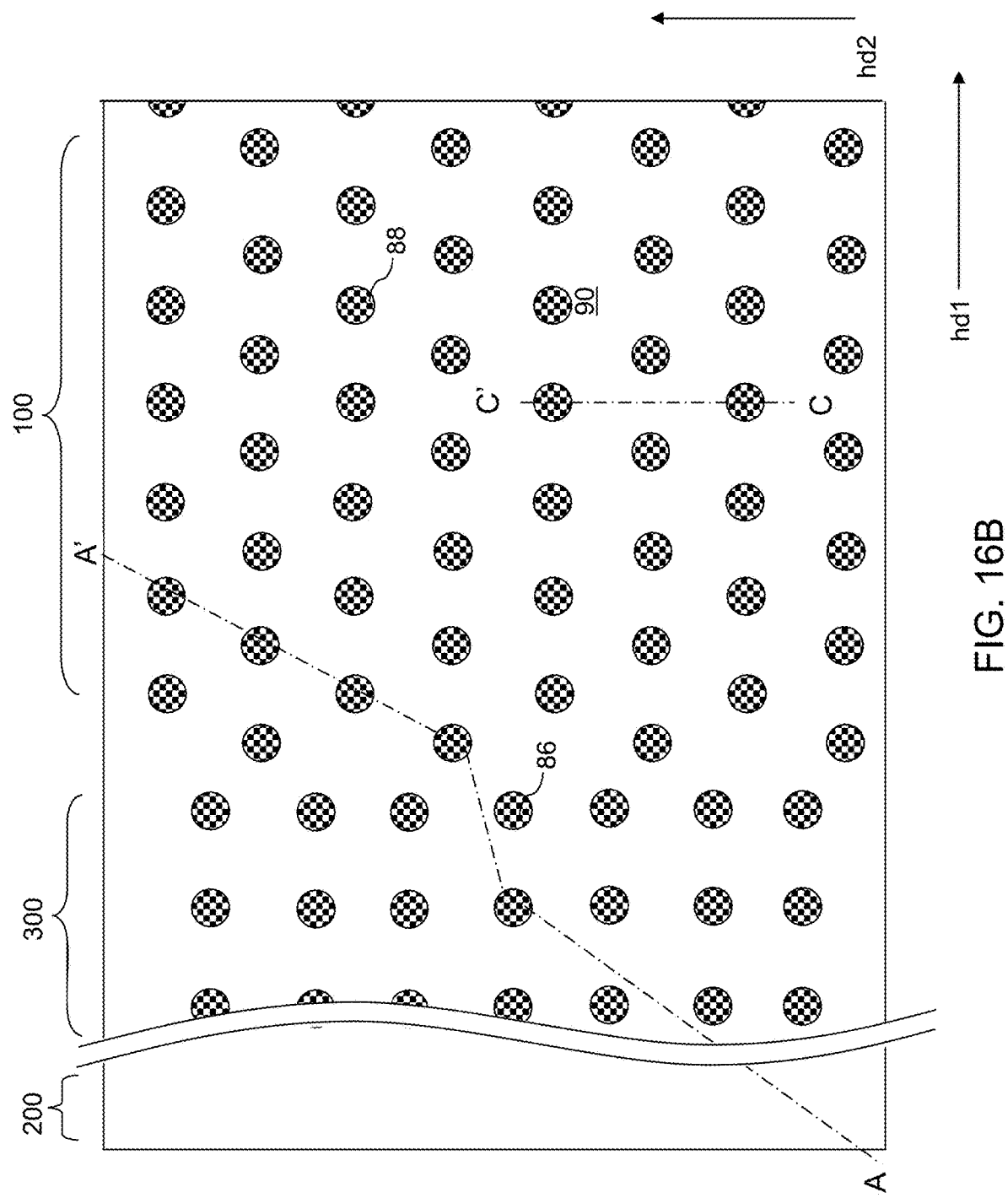
FIG. 16B is a top-down view of the exemplary structure of FIG. 16A. The hinged vertical plane A-A' is the plane of the vertical cross-section of FIG. 16A.
Figure 16C:
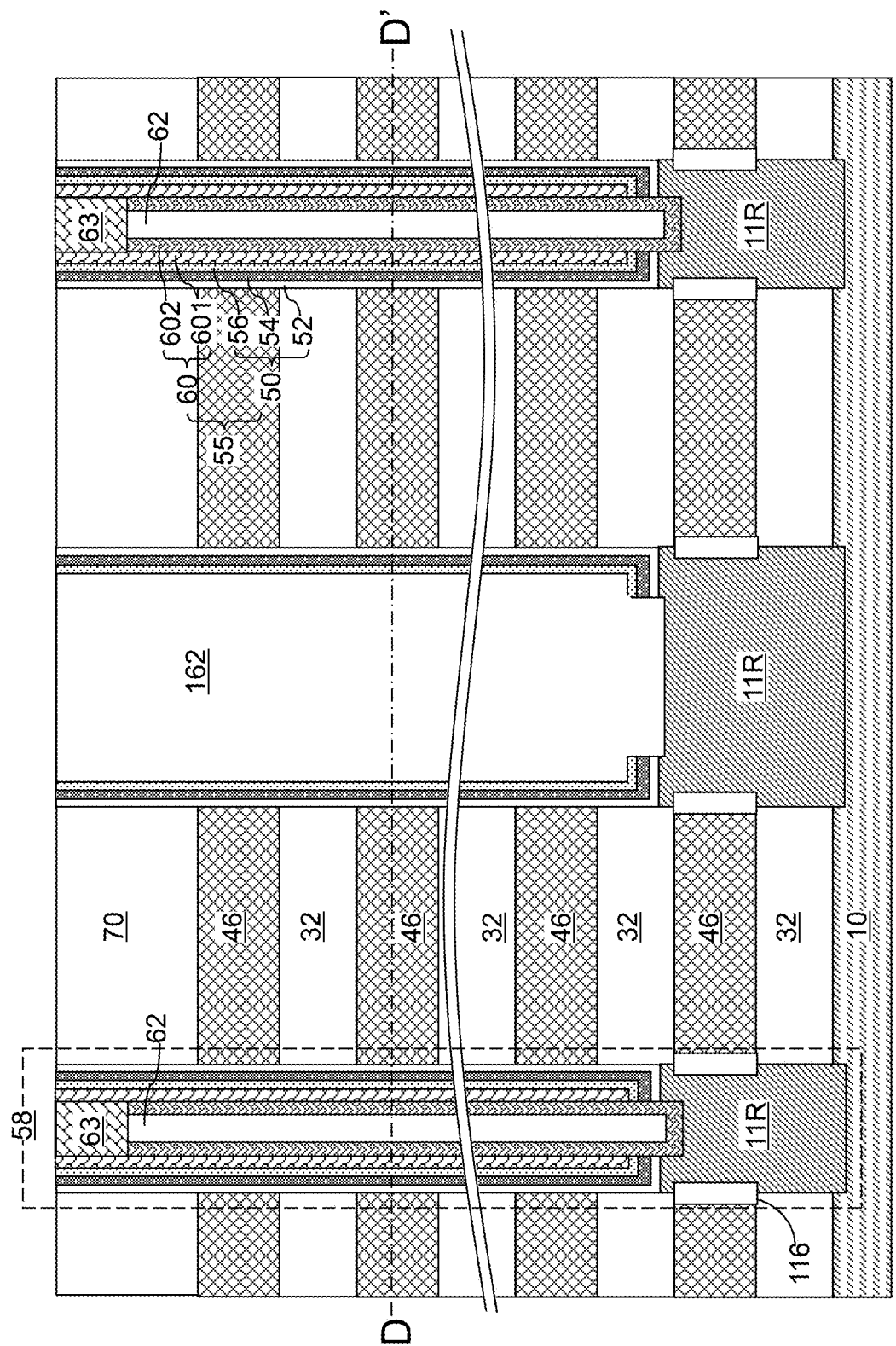
FIG. 16C is a vertical cross-sectional view of the exemplary structure along the vertical plane C-C' of FIG. 11B.
Figure 16D:
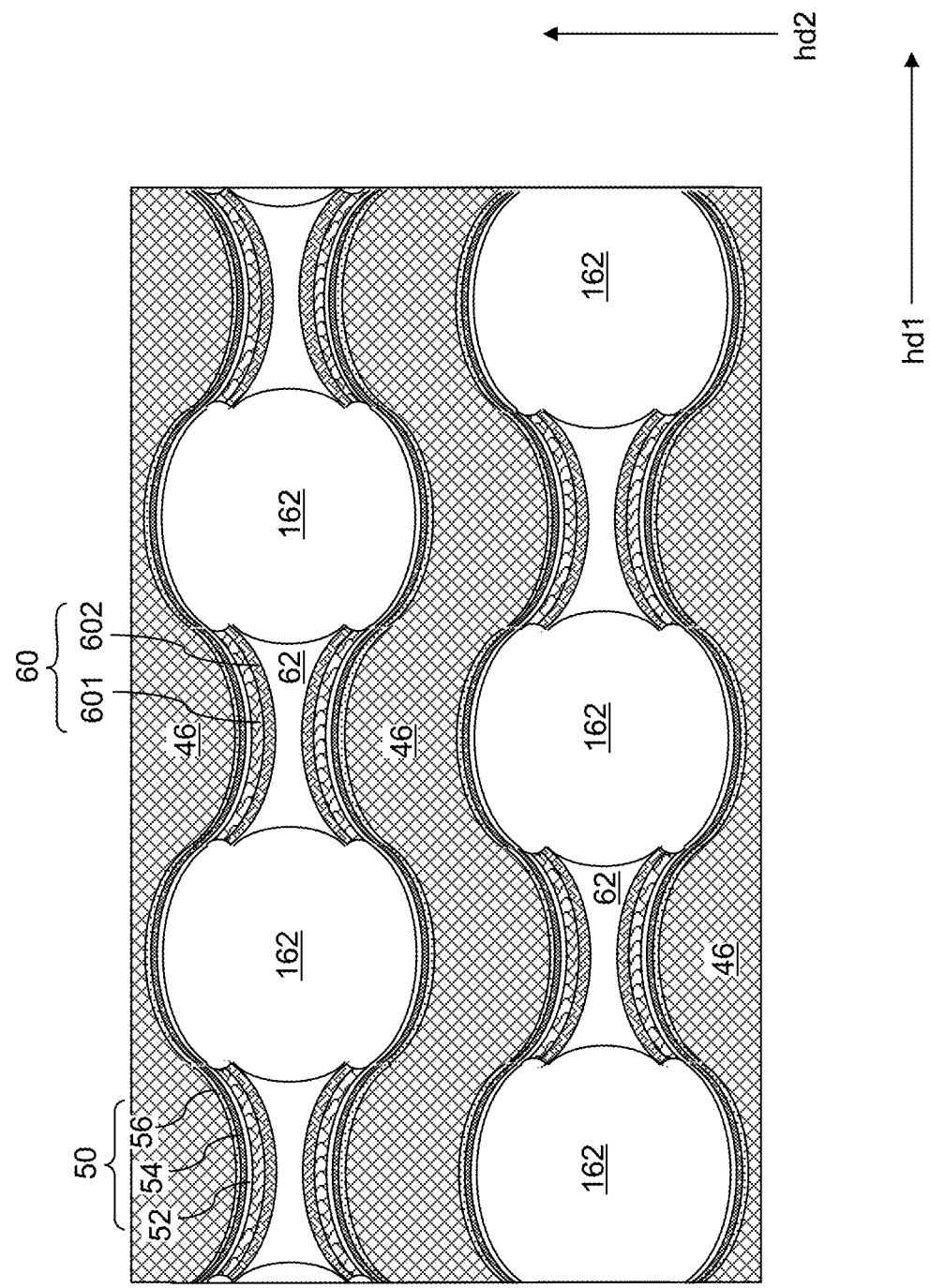
FIG. 16D is a horizontal cross-sectional view of the exemplary structure along the horizontal plane D-D' of FIG. 16C.

Referring to FIG. 15, a dielectric material is deposited in the backside via cavities 69 and the elongated backside trenches 169 to form dielectric pillar structures 76 and dielectric wall structures 176. Each dielectric pillar structure 76 fills a respective backside via cavity 69. Each dielectric wall structure 176 fills a respective elongated backside trench 169. Each of the dielectric wall structures 176 can laterally extend along the first horizontal direction hd1. Each of the dielectric pillar structures 76 and the dielectric wall structures 176 can vertically extend through each layer of an alternating stack of the insulating strips 32 and the electrically conductive strips 46.

Referring to FIGS. 16A-16D, a dielectric material such as silicon oxide or organosilicate glass can be deposited over the insulating cap layer 70 to form a contact level dielectric layer 90. For example, plasma enhanced chemical vapor deposition (PECVD) or atmospheric pressure chemical vapor deposition (APCVD) can be employed to deposit the dielectric material. The thickness of the contact level dielectric layer 90 can be in a range from 20 nm to 200 nm, although lesser and greater thicknesses can also be employed.

Drain contact via structures 88 and word line contact via structures 86 can be formed through the contact level dielectric layer 90. The drain contact via structures 88 can be formed on a respective one of the drain regions 63. The word line contact via structures 86 can be formed on a respective one of the electrically conductive strips 46 within the region of the stepped surfaces. Each of the alternating stacks (32, 46) can have respective stepped surfaces that extend from the substrate (9, 10) to a topmost electrically conductive strip 46 within a respective alternating stack (32, 46). A two-dimensional array of contact via structures 86 can be provided, which contacts a top surface of a respective one of the electrically conductive strips 46 within the alternating stacks (32, 46) in the contact region 300.

Additional metal contact structures can be formed to provide electrical wiring among the various nodes of the exemplary device. Subsequently, bit lines (not shown) extending along the second horizontal direction hd2 can be formed in electrical contact with a respective set of drain contact via structures 88.

Figure 17:
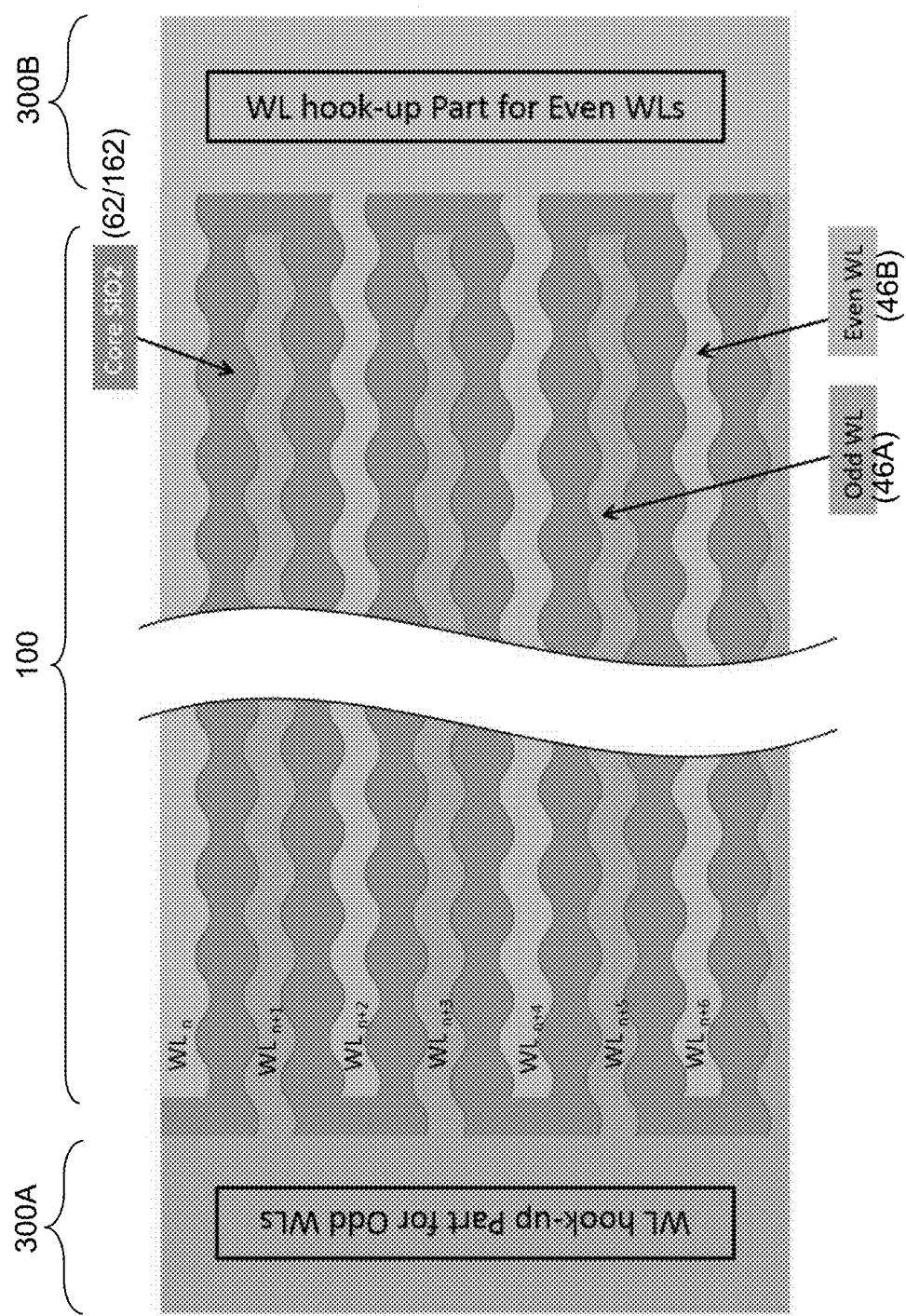
FIG. 17 is a horizontal cross-sectional view of a configuration of the exemplary structure after formation of electrically conductive strips according to an embodiment of the present disclosure.

Referring to FIG. 17, an embodiment configuration of the exemplary structure is illustrated at the level of a set of the electrically conductive strips 46, which function as word lines for the memory stack structures 55. Odd-numbered electrically conductive strips (e.g., word lines) 46A can be connected to respective word line contact via structures 86 in a first contact region 300A, and even-numbered electrically conductive strips (e.g., word lines) 46B can be connected to respective word line contact via structures 86 in a second contact region 300B located on the opposite side of the memory array region (e.g., memory plane) 100 from the first contact region 300A. This configuration provides sufficient space to connect the relatively narrow word lines 46 to the respective word line contact via structures 86. Memory films 50 and vertical semiconductor channels 60 are not illustrated in the view of FIG. 17 for clarity.

Referring to all drawings and according to various embodiments of the present disclosure, a three-dimensional memory device is provided, which comprises: alternating stacks of insulating strips 32 and electrically conductive strips 46 located over a substrate (9, 10), generally extending along a first horizontal direction hd1, and laterally spaced apart from each other along a second horizontal direction hd2 by width-modulated line trenches 149, memory films 50 located on a respective sidewall of the alternating stacks (32, 46), generally extending along the first horizontal direction hd1, and laterally undulating along the second horizontal direction hd2, and discrete vertical semiconductor channels 60 located on a sidewall of a respective one of the memory films 50.

In one embodiment, each of plurality of discrete vertical semiconductor channels 60 includes a respective laterally-concave and vertically-planar outer sidewall that contacts a laterally-convex and vertically-planar sidewall of the respective one of the memory films 50.

In one embodiment, each of the width-modulated line trenches 149 has a pair of sidewalls that generally extend along the first horizontal direction hd1; and each of the pair of sidewalls includes a laterally alternating sequence of laterally-concave and vertically-planar sidewall segments and laterally-convex and vertically-planar sidewall segments.

In one embodiment, each of the width-modulated line trenches 149 includes a periodic laterally alternating sequence of a neck region 149N and a bulbous region 149B having a greater width W2 than the width W1 of the neck region 149N. Each of the vertical semiconductor channels 60 is located in one of the neck regions 149N.

In one embodiment, a neck region 149N of a first width-modulated line trench 149 within each neighboring pair of the width-modulated line trenches 149 is laterally offset along the first horizontal direction hd1 from a neck region 149N of a second width-modulated line trench 149 within each neighboring pair of the width-modulated line trenches 149 by a lateral offset distance that is one half of a periodicity p of neck regions of the first width-modulated line trench 149 along the first horizontal direction hd1.

In one embodiment, each of the vertical semiconductor channels 60 includes a respective laterally-convex and vertically-planar inner sidewall that contacts a respective dielectric core. The discrete vertical semiconductor channels 60 are located only in the neck regions 149N while the memory film is located in both the neck regions 149N and the bulbous regions 149B. The vertical semiconductor channels 60 have a uniform lateral thickness throughout.

In one embodiment, a two-dimensional array of dielectric pillar structures 162 can be located within the bulbous regions of the width-modulated line trenches 149. In one embodiment, each of the dielectric pillar structures 162 includes a pair of first laterally-convex and vertically-planar sidewalls that contact a respective pair of memory films 50. In one embodiment, each of the dielectric pillar structures 162 includes a pair of second laterally-convex and vertically-planar sidewalls that contact a respective pair of dielectric cores 62.

In one embodiment, each of the width-modulated line trenches 149 includes a laterally alternating sequence of dielectric cores 62 and dielectric pillar structures 162; and each interface between a neighboring pair of a dielectric core 62 and a dielectric pillar structure 162 includes a surface at which a laterally convex-sidewall of the dielectric pillar structure contacts a laterally-concave sidewall of the dielectric core 62.

In one embodiment, the insulating strips 32 and the electrically conductive strips 46 have a substantially uniform width W3 in the second horizontal direction hd2.

In one embodiment, each of the memory films 50 includes a respective layer stack that comprises: a blocking dielectric 52 that contacts a respective one of the alternating stacks (32, 46); a charge storage layer 54 contacting the blocking dielectric 52; and a tunneling dielectric 56 contacting the charge storage layer 54. A row of discrete vertical semiconductor channels 60 is located within the neck regions 149N of the respective width-modulated line trench 149.

In one embodiment, the three-dimensional memory device can comprise: a contact region 300 in which each of the alternating stacks (32, 46) has respective stepped surfaces that extend from the substrate (9, 10) to a topmost electrically conductive strip 46 within a respective alternating stack (32, 46); and a two-dimensional array of contact via structures 86 contacting a top surface of a respective one of the electrically conductive strips 46 within the alternating stacks (32, 46) in the contact region 300.

In embodiments, the width-modulated line trenches 149 can provide an increased areal density of vertical semiconductor channels 60 compared to discrete memory openings. Further, a pair of vertical semiconductor channels 60 is formed within each neck region 149N of the width-modulated line trenches 149, thereby further increasing the areal device density. In addition, the curvature in the memory films 50 enhances concentration of electrical fields during programming and erasing, thereby lowering the operational voltage of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
alternating stacks of insulating strips and electrically conductive strips located over a substrate, generally extending along a first horizontal direction, and laterally spaced apart from each other along a second horizontal direction by width-modulated line trenches, wherein each of the width-modulated line trenches comprises a respective pair of sidewalls defined by surfaces of a respective pair of alternating stacks and includes a laterally alternating sequence of laterally-concave and vertically-planar sidewall segments and laterally-convex and vertically-planar sidewall segments;
memory films located on a respective sidewall of the alternating stacks, generally extending along the first horizontal direction, and laterally undulating along the second horizontal direction; and
a plurality of discrete vertical semiconductor channels located on first portions of a sidewall of a respective one of the memory films that contact the laterally-convex and vertically-planar sidewall segments of the width-modulated line trenches, wherein gaps between neighboring pairs of vertical semiconductor channels are present adjacent to second portions of the memory films that are located on the laterally-concave and vertically-planar sidewall segments of the width-modulated line trenches;
wherein each of the memory films includes a respective layer stack that comprises a blocking dielectric that contacts a respective one of the alternating stacks, a charge storage layer contacting the blocking dielectric, and a tunneling dielectric contacting the charge storage layer and a row of vertical semiconductor channels located within a respective width-modulated line trench.

2. The three-dimensional memory device of claim 1, wherein:
each of plurality of discrete vertical semiconductor channels includes a respective laterally-concave and vertically-planar outer sidewall that contacts a laterally-convex and vertically-planar sidewall of the respective one of the memory films; and
each of the width-modulated line trenches has the pair of sidewalls that generally extend along the first horizontal direction.

3. The three-dimensional memory device of claim 1, wherein:
each of the width-modulated line trenches includes a periodic laterally alternating sequence of a neck region and a bulbous region having a greater width than a width of the neck region; and
each of the discrete vertical semiconductor channels is located in one of the neck regions.

4. The three-dimensional memory device of claim 3, wherein a neck regions of a first width-modulated line trench within each neighboring pair of the width-modulated line trenches is laterally offset along the first horizontal direction from a neck region of a second width-modulated line trench within each neighboring pair of the width-modulated line trenches by a lateral offset distance that is one half of a periodicity of neck regions of the first width-modulated line trench along the first horizontal direction.

5. The three-dimensional memory device of claim 3, wherein:
each of the vertical semiconductor channels includes a respective laterally-convex and vertically-planar inner sidewall that contacts a respective dielectric core; and
each memory film continuously extends through the neck regions and the bulbous regions of a respective one of the width-modulated line trenches.

6. The three-dimensional memory device of claim 5, further comprising a two-dimensional array of dielectric pillar structures located within the bulbous regions of the width-modulated line trenches.

7. The three-dimensional memory device of claim 6, wherein each of the dielectric pillar structures includes a pair of first laterally-convex and vertically-planar sidewalls that contact a respective pair of memory films.

8. The three-dimensional memory device of claim 7, wherein each of the dielectric pillar structures includes a pair of second laterally-convex and vertically-planar sidewalls that contact a respective pair of dielectric cores.

9. The three-dimensional memory device of claim 6, wherein:
each of the width-modulated line trenches includes a laterally alternating sequence of the dielectric cores comprising a first dielectric material and the dielectric pillar structures comprising a second dielectric material; and
each interface between a neighboring pair of a dielectric core and a dielectric pillar structure includes a surface at which a laterally convex-sidewall of the dielectric pillar structure contacts a laterally-concave sidewall of the dielectric core.

10. The three-dimensional memory device of claim 9, wherein:
the first dielectric material comprises a material selected from doped silicate glass, undoped silicate glass, or organosilicate glass; and
the second dielectric material comprises a material selected from undoped silicate glass, doped silicate glass, or organosilicate glass.

11. The three-dimensional memory device of claim 9, wherein each of the dielectric pillar structures includes a pair of first laterally-convex and vertically-planar sidewalls that contact a respective pair of memory films located within a respective one of the width-modulated line trenches.

12. The three-dimensional memory device of claim 1, wherein the insulating strips and the electrically conductive strips have a substantially uniform width in the second horizontal direction.

13. The three-dimensional memory device of claim 1, further comprising:
a contact region in which each of the alternating stacks has respective stepped surfaces that extend from the substrate to a topmost electrically conductive strip within a respective alternating stack; and
a two-dimensional array of contact via structures contacting a top surface of a respective one of the electrically conductive strips within the alternating stacks in the contact region.

14. The three-dimensional memory device of claim 1, wherein:
each of the width-modulated line trenches includes a periodic laterally alternating sequence of a neck region and a bulbous region having a greater width than a width of the neck region;

dielectric cores comprising a first dielectric material are located within the bulbous regions of the width-modulated line trenches; and dielectric pillar structures comprising a second dielectric material are located within the bulbous regions of the width-modulated line trenches having a greater lateral dimension along a widthwise direction of the width-modulated line trenches than a maximum lateral dimension of each of the dielectric cores along the widthwise direction of the width-modulated line trenches.

15. The three-dimensional memory device of claim 14, wherein:

each of the width-modulated line trenches includes a respective laterally alternating sequence of dielectric cores and dielectric pillar structures; and each interface between a neighboring pair of a dielectric core and a dielectric pillar structure within each of the width-modulated line trenches includes a surface at which a laterally convex-sidewall of the dielectric pillar structure contacts a laterally-concave sidewall of the dielectric core.

16. The three-dimensional memory device of claim 14, wherein one of the dielectric pillar structures is in direct contact with:

sidewall of four vertical semiconductor channels among the vertical semiconductor channels;

sidewalls of two dielectric cores among the dielectric cores; and sidewalls of two memory films among the memory films.

17. The three-dimensional memory device of claim 1, wherein each of the vertical semiconductor channels comprises a respective laterally-concave and vertically-planar outer sidewall contacting a laterally-convex and vertically-planar sidewall of a respective first portion of the memory films.

18. The three-dimensional memory device of claim 17, further comprising a two-dimensional array of dielectric cores located within the width-modulated line trenches, wherein each dielectric core within the array of dielectric cores comprise a respective pair of laterally-concave and vertically planar sidewalls.

19. The three-dimensional memory device of claim 18, wherein each laterally-concave and vertically planar sidewall is in contact with a respective laterally-convex and vertically-planar outer sidewall of one of the vertical semiconductor channels.

* * * * *